United States Patent
Shirakawa

(10) Patent No.: US 10,050,029 B2
(45) Date of Patent: Aug. 14, 2018

(54) SEMICONDUCTOR DEVICE

(71) Applicant: Fuji Electric Co., Ltd., Kanagawa (JP)

(72) Inventor: Tohru Shirakawa, Nagano (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 248 days.

(21) Appl. No.: 15/232,479

(22) Filed: Aug. 9, 2016

(65) Prior Publication Data

US 2017/0077084 A1   Mar. 16, 2017

(30) Foreign Application Priority Data

Sep. 16, 2015   (JP) .................................. 2015-182909

(51) Int. Cl.

| | |
|---|---|
| *H02H 3/22* | (2006.01) |
| *H01L 27/02* | (2006.01) |
| *H01L 29/06* | (2006.01) |
| *H01L 29/739* | (2006.01) |
| *H01L 29/78* | (2006.01) |
| *H03K 17/0814* | (2006.01) |
| *H03K 17/12* | (2006.01) |

(52) U.S. Cl.
CPC ...... *H01L 27/0266* (2013.01); *H01L 27/0255* (2013.01); *H01L 27/0259* (2013.01); *H01L 29/0634* (2013.01); *H01L 29/7395* (2013.01); *H01L 29/7811* (2013.01); *H03K 17/0814* (2013.01); *H03K 17/12* (2013.01); *H03K 17/122* (2013.01); *H03K 17/127* (2013.01)

(58) Field of Classification Search
USPC .................................................... 361/56, 111
See application file for complete search history.

(56) References Cited

U.S. PATENT DOCUMENTS 4,941,030 A * 7/1990 Majumdar .......... H01L 27/0716
                                                        257/378
9,041,456 B2   5/2015 Hasegawa et al.
(Continued)

FOREIGN PATENT DOCUMENTS

| JP | 2012-253202 A | 12/2012 |
|---|---|---|
| JP | 2013-125806 A | 6/2013 |
| JP | 2014-130909 A | 7/2014 |

*Primary Examiner* — Danny Nguyen
(74) *Attorney, Agent, or Firm* — Chen Yoshimura LLP

(57) ABSTRACT

A semiconductor device for driving a load includes: a protection circuit configured to be connected to the load, the protection circuit including a protection diode, a diode-connected unipolar protection element, and a diode-connected bipolar protection element, all of which are connected in parallel so that when connected to the load, the protection diode, the diode-connected unipolar protection element, and the diode-connected bipolar protection element are connected in parallel to the load; and a switching circuit that is connected in series to the protection circuit and that performs a switching operation so as to drive the load. The protection diode, the diode-connected unipolar protection element, and the diode-connected bipolar protection element are connected in such a polarity that each is reverse-biased when the switching circuit is turned ON, and consume a discharge current resulting from a counter-electromotive force from the load when the switching circuit is turned OFF.

9 Claims, 25 Drawing Sheets

(56) References Cited

U.S. PATENT DOCUMENTS 9,106,156 B2 8/2015 Tanaka et al.
2015/0002975 A1* 1/2015 Rozman ............... H02H 9/047
361/111

* cited by examiner

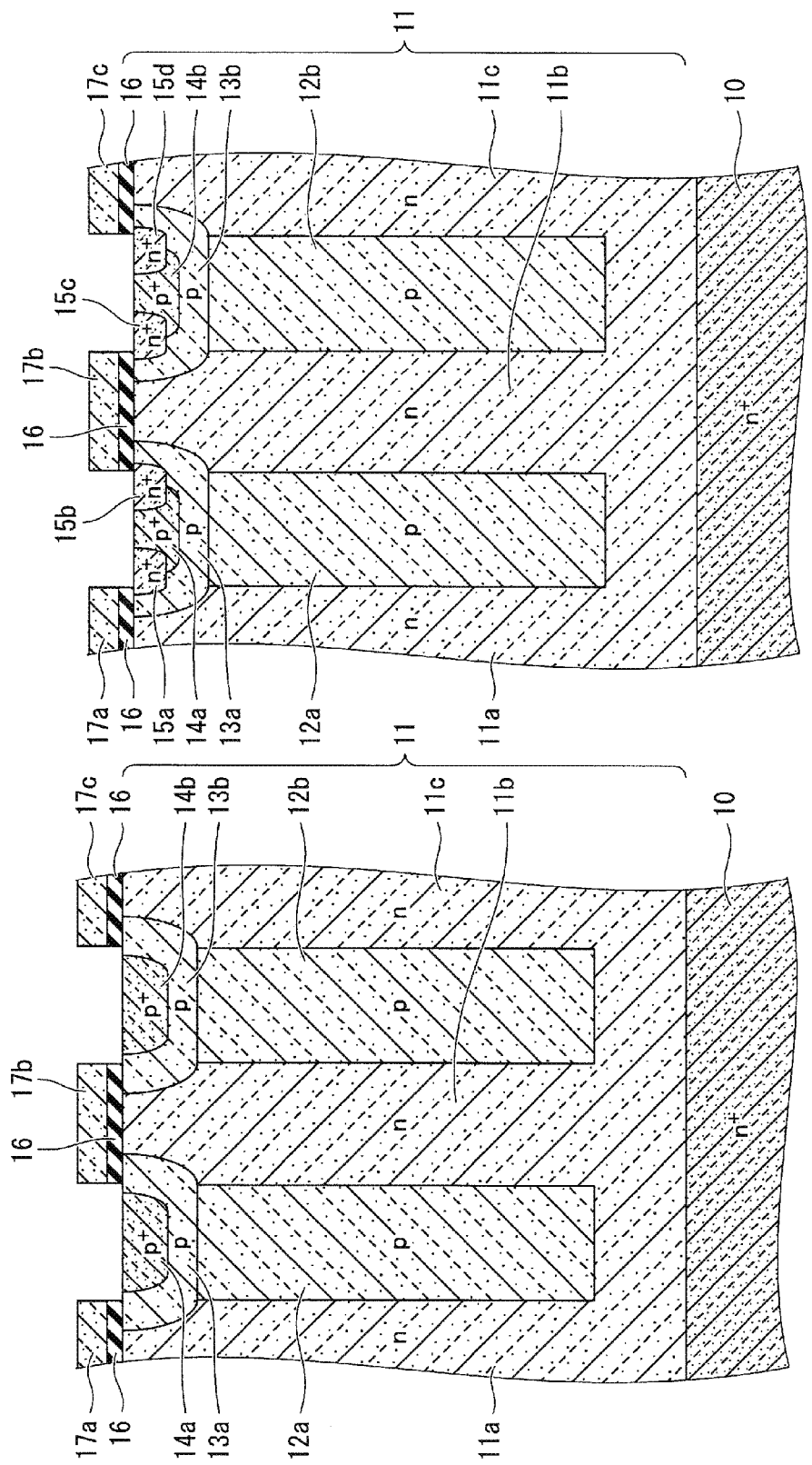

SEMICONDUCTOR DEVICE

BACKGROUND OF THE INVENTION

Technical Field

The present invention relates to a semiconductor device, and in particular, relates to a power switching device that can be applied to motor control, power conversion, and the like.

Background Art

Configurations in which IGBTs and MOSFETs are connected in parallel are well-known as power switching devices that are applied in conventional motor control, power conversion, and the like (see Patent Document 1). According to the configuration disclosed in Patent Document 1, it is possible to utilize differences in threshold voltage between IGBTs and MOSFETs to reduce switching losses by causing the IGBTs and MOSFETs to operate in parallel.

RELATED ART DOCUMENT

Patent Document

Patent Document 1: Japanese Patent Application Laid-Open Publication No. 2013-125806

SUMMARY OF THE INVENTION

Protection circuits, which consume discharge current that results from the counter-electromotive force of a load when a switching element is turned OFF, are generally provided in power switching devices, with various types of configurations having been investigated for use as protection circuits.

An aim of the present invention is to provide a semiconductor device that utilizes a new configuration in a protection circuit that consumes discharge current resulting from the counter-electromotive force of a load when a power switching device is turned OFF. Accordingly, the present invention is directed to a scheme that substantially obviates one or more of the problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device for driving a load, including: a protection circuit configured to be connected to the load, the protection circuit including a protection diode, a diode-connected unipolar protection element, and a diode-connected bipolar protection element, all of which are connected in parallel so that when connected to the load, the protection diode, the diode-connected unipolar protection element, and the diode-connected bipolar protection element are connected in parallel to the load; and a switching circuit that is connected in series to the protection circuit and that performs a switching operation so as to drive the load, wherein the protection diode, the diode-connected unipolar protection element, and the diode-connected bipolar protection element are connected in such a polarity that each is reverse-biased when the switching circuit is turned ON, and consume a discharge current resulting from a counter-electromotive force from the load when the switching circuit is turned OFF.

In another aspect, the present disclosure provides a semiconductor device for driving a load, including: a protection circuit having a first node and a second node configured to be connected to respective terminals of the load, the protection circuit including a protection diode, a diode-connected unipolar transistor, and a diode-connected bipolar transistor, all of which are connected in parallel between the first node and the second node in a reversed-biased manner, the first node being configured to be connected to a positive terminal of a DC power source; and a switching circuit having a first node and a second node, the switching circuit including a unipolar transistor and a bipolar transistor, connected in parallel to each other between the first node and the second node, respective gates of the unipolar transistor and the bipolar transistor being commonly controlled, the first node of the switching circuit being connected to the second node of the protection circuit, and the second node of the switching circuit being configured to be connected to a negative terminal of the DC power source so that when the switching circuit is turned ON, the load is driven by a current path formed between the first node of the protection circuit and the second node of the switching circuit, and when the switching circuit is turned OFF, the protection circuit consumes a discharge current resulting from a counter-electromotive force from the load.

According to the present invention, it is possible to provide a semiconductor device that utilizes a new configuration in a protection circuit that consumes discharge current resulting from a counter-electromotive force of a load when a power switching device is turned OFF.

It is to be understood that both the foregoing general description and the following detailed description are exemplary and explanatory, and are intended to provide further explanation of the invention as claimed.

BRIEF DESCRIPTION OF THE DRAWINGS

FIGS. 18A and 18B are cross-sectional views of steps after that of FIG. 17B that show one example of a manufacturing method of a unipolar protection element according to an embodiment of the present invention.

DETAILED DESCRIPTION OF EMBODIMENTS

Figure 1:
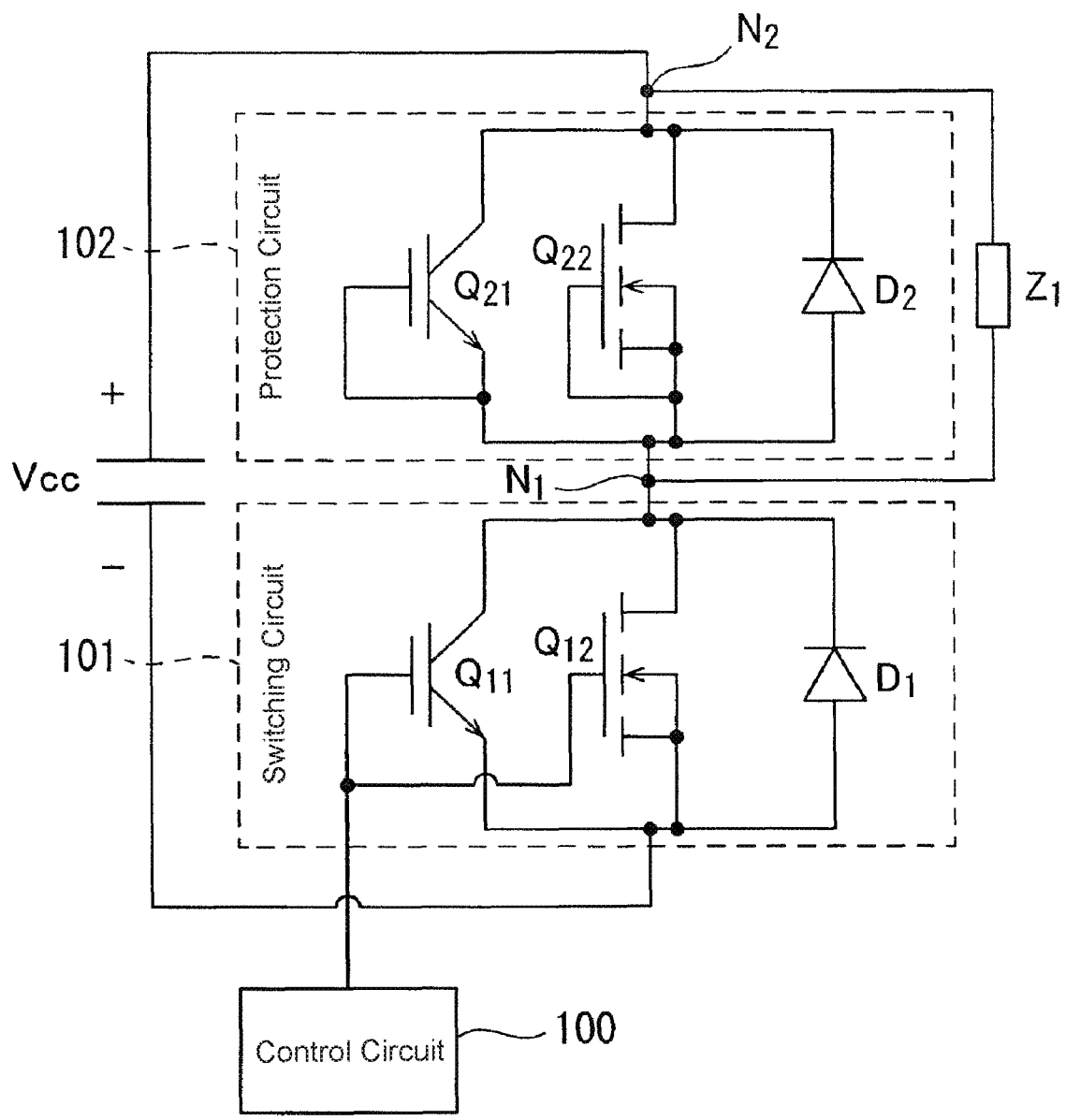
FIG. 1 is a circuit diagram that shows one example of a semiconductor device according to an embodiment of the present invention.

Protection circuits, which consume discharge current that results from a counter-electromotive force of a load when a switching element is turned OFF, are generally provided in power switching devices. One configuration that has been investigated as such a protection circuit is a configuration in which a bipolar protection element such as an IGBT and a unipolar protection element such as a MOSFET are connected in parallel so as to operate as a reverse-biased diode, thereby allowing the circuit to be used for current ranging from a small-current region of approximately several amperes to a large current region of approximately several hundred amperes.

The inventors discovered a problem in that, in a protection circuit in which a bipolar protection element and a unipolar protection element were connected in parallel, discharge current became concentrated in the unipolar protection element, which had a relatively lower ON resistance than the bipolar protection element, in the small current region during the operation of an inductive load such as a motor. This concentration of discharge current led to a shortening of the life of the unipolar protection element. In particular, when a superjunction (SJ) MOSFET, in which a plurality of p-type columns and n-type columns were alternately formed, was used, there was an overshoot in the surge voltage as a result of a rapid spread of the depletion layer during reverse recovery, increasing the likelihood of damage.

An embodiment of the present invention will be described with reference to the drawings while taking into consideration the above-mentioned problems. In the drawings referenced in the description below, portions that are the same or similar will be assigned the same or similar reference characters. It should be noted, however, that the drawings are schematic, and that the relationship between the thickness and the planar dimensions, the thickness ratios of the various layers, and the like, differ from reality. Thus, specific thicknesses and dimensions should be determined based on the description below. In addition, there are portions that differ in the depicted dimensional relationships and ratios among the various drawings. Furthermore, the embodiments below describe examples of a semiconductor device that are used to embody the technical ideas of the present invention, and the technical ideas of the present invention are not limited to the materials, shapes, structures, positions, and the like of the components described below. Various modifications can be made to the technical ideas of the present invention that are within the technical scope defined by the various claims set forth in the claims.

In addition, the conductive semiconductor device described in the present specification is one example of a semiconductor device, and it is not necessary to limit the present invention to the selection of the conductive semiconductor device used in the description below. Furthermore, in the present specification and attached drawings, layers and regions marked with an "n" or "p" respectively signify that electrons or holes are the majority carrier. A "+" or "−" attached to the top of an "n" or "p" indicates a semiconductor region in which the impurity density is relatively higher or lower than a semiconductor region not having a "+" or "−". In addition, in the present specification, the terms "upper" and "lower" used in "upper side", "lower side", and the like, are simply expressions used to explain the cross-sectional views in the drawings. If the drawings are viewed after shifting the orientation of the semiconductor device by 90 degrees, "upper" and "lower" become "left" and "right", and if the drawings are viewed after shifting the orientation of the semiconductor device by 180 degrees, the relationship between "upper" and "lower" becomes reversed, for example.

<Semiconductor Device>

As shown in FIG. 1, a semiconductor device according to an embodiment of the present invention is a power switching device that includes: a switching circuit 101 that is connected in series to a load $Z_1$ and performs a switching operation so as to drive the load $Z_1$; and a protection circuit 102 that is connected in series to the switching circuit 101, is connected in parallel to the load $Z_1$, and consumes a discharge current resulting from a counter-electromotive force from the load $Z_1$ when the switching circuit 101 is turned OFF. It is possible to use a motor or the like, for example, as the load $Z_1$.

The switching circuit 101 includes: a bipolar power switching element $Q_{11}$, a unipolar power switching element $Q_{12}$, and a freewheeling diode (FWD) $D_1$ that are connected in parallel. It is possible to use an IGBT, a static induction (SI) thyristor, a gate turn-off (GTO) thyristor, or the like, for example, as the bipolar power switching element $Q_{11}$, and a MOS transistor or a MIS transistor, for example, can be used as the unipolar power switching element $Q_{12}$. MOS transistors include MOSFETs and MOSSITs. Similarly, MIS transistors includes semiconductor elements with an insulated-gate structure such as MISFETs and MISSITs. For ease of description, a case will be described as an example below in which an IGBT is used as the bipolar power switching element $Q_{11}$ and a MOSFET is used as the unipolar power switching element $Q_{12}$.

Normally, the ON threshold voltage of an IGBT, which is a bipolar element, is higher than the ON threshold voltage of a MOSFET, which is a unipolar element, in the small-current region as a result of the influence of the built-in potential; thus, the bipolar power switching element $Q_{11}$ has larger conduction losses than the unipolar power switching element $Q_{12}$ in the small-current region. Meanwhile, the unipolar power switching element $Q_{12}$ has larger conduction losses than the bipolar power switching element $Q_{11}$ when there is a large amount of current.

The gate of the bipolar power switching element $Q_{11}$ and the gate of the unipolar power switching element $Q_{12}$ are both connected to a control circuit 100, and receive a common control signal from the control circuit 100. The collector side of the bipolar power switching element $Q_{11}$, the drain side of the unipolar power switching element $Q_{12}$, and the cathode side of the freewheeling diode $D_1$ are connected to the protection circuit 102 and a load $Z_1$ side terminal $N_1$. The emitter side of the bipolar power switching element $Q_{11}$, the source side of the unipolar power switching element $Q_{12}$, and the anode side of the freewheeling diode $D_1$ are connected to the negative pole side of a power source $V_{CC}$.

Normally, di/dt of the current between the collector and emitter when the IGBT, which is a bipolar element, is turned ON/OFF is more gradual than di/dt of the current between the drain and source when the MOSFET, which is a unipolar element, is turned ON/OFF. Furthermore, since the di/dt of the current is a combination of the di/dt of the current between the drain and source of the MOSFET and the di/dt of the current between the collector and the emitter of the IGBT, di/dt becomes even more gradual, resulting in an increase in turn-on losses. Therefore, it is possible to reduce turn-on losses by turning ON the unipolar power switching element $Q_{12}$, which has a faster switching speed than the bipolar power switching element $Q_{11}$, first. However, in cases in which it is not desirable to pass a large amount of current to the unipolar power switching element $Q_{12}$ side, the bipolar power switching element $Q_{11}$ may be turned ON first, and the order in which the bipolar power switching element $Q_{11}$ and the unipolar power switching element $Q_{12}$ are turned ON may be changed according to the amount of current.

The protection circuit 102 has a diode-connected bipolar protection element $Q_{21}$, a diode-connected unipolar protection element $Q_{22}$, and a protection diode $D_2$ that are connected in parallel to the load $Z_1$. The bipolar protection element $Q_{21}$, the unipolar protection element $Q_{22}$, and the protection diode $D_2$ are biased to a reverse polarity, and consume a discharge current resulting from a counter-electromotive force from the load $Z_1$ when the switching circuit 101 is turned OFF. An IGBT, an SI thyristor, a GTO thyristor, or the like, for example, can be used as the bipolar protection element $Q_{21}$, and a MOS transistor or a MIS transistor, for example, can be used as the unipolar protection element $Q_{22}$. For ease of description, a case will be described as an example below in which an IGBT is used as the bipolar protection element $Q_{21}$ and a MOSFET is used as the unipolar protection element $Q_{22}$.

The collector side of the bipolar protection element $Q_{21}$, the drain side of the unipolar protection element $Q_{22}$, and the cathode side of the protection diode $D_2$ are connected to a terminal $N_2$ on the positive pole side of the power source $V_{CC}$. The emitter side of the bipolar protection element $Q_{21}$, the source side of the unipolar protection element $Q_{22}$, and the anode side of the protection diode $D_2$ are connected to the terminal $N_1$ on the switching circuit 101 side. The gate of the bipolar protection element $Q_{21}$ is connected to the emitter, and by having the gate and the emitter have the same potential, the bipolar protection element $Q_{21}$ operates as a reverse diode. The bipolar protection element $Q_{21}$ may be caused to operate as a reverse diode by connecting the gate of the bipolar protection element $Q_{21}$ to the control circuit 100, instead of connecting the gate of the bipolar protection element $Q_{21}$ to the emitter, and controlling the potential between the gate and the emitter so as to be 0V. The gate of the unipolar protection element $Q_{22}$ is connected to the source, and the gate and the source have the same potential, thereby causing the unipolar protection element $Q_{22}$ to function as a reverse diode.

Figure 2:
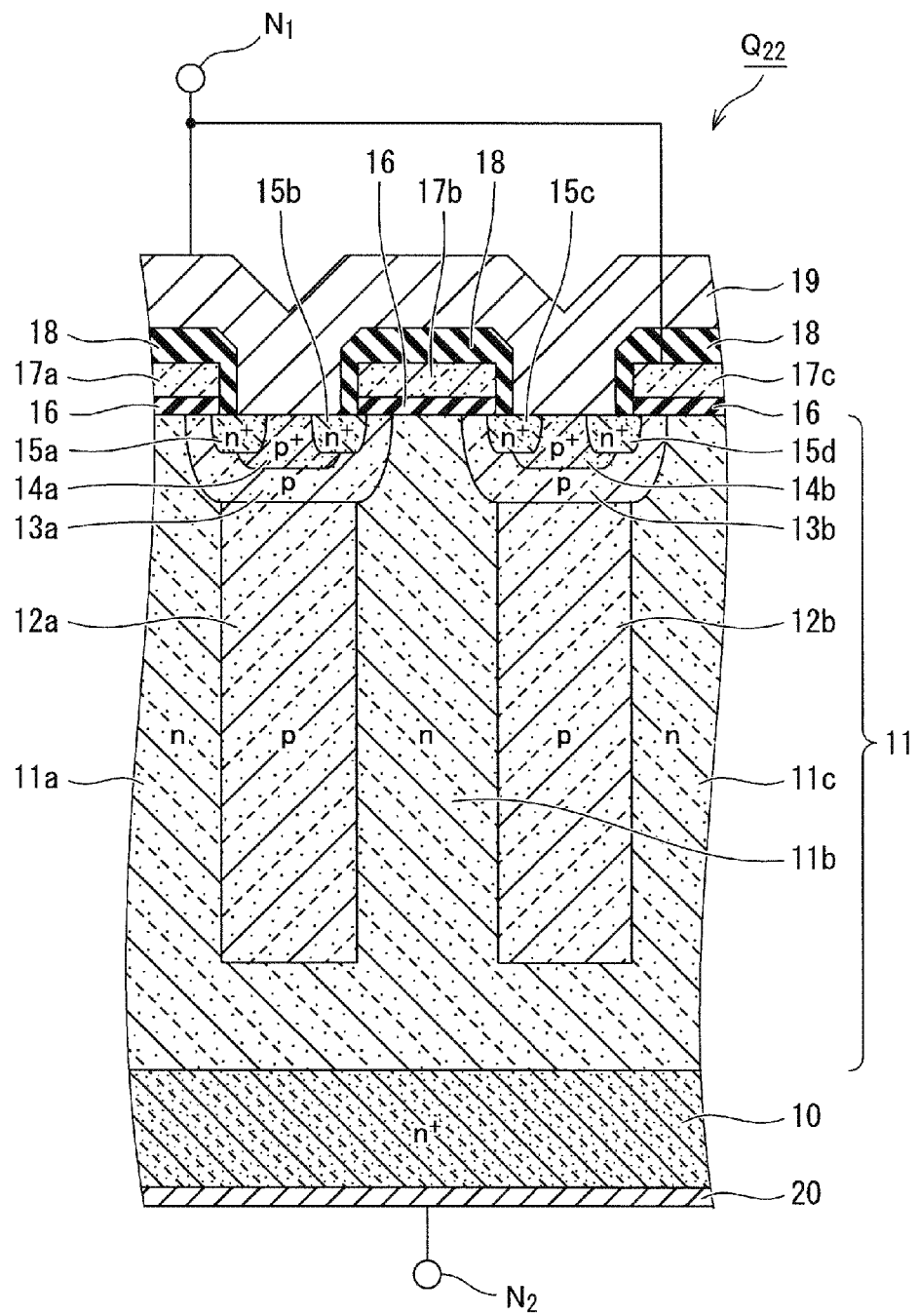
FIG. 2 is a cross-sectional view that shows one example of a unipolar protection element (an SJ-MOS) according to an embodiment of the present invention.

As shown in FIG. 2, for example, which shows the cross-sectional structure of a portion of the unipolar protection element $Q_{22}$ of the protection circuit 102 in the semiconductor device according to an embodiment of the present invention, a MOSFET with a superjunction (SJ) structure (hereafter abbreviated as "SJ-MOS"), in which a plurality of p-type columns 12a, 12b are repeatedly arranged within an n-type drift region 11 and portions of the drift region 11 that are located on either side of the p-type columns 12a, 12b are defined as n-type columns 11a, 11b, 11c, can be suitably used as the unipolar protection element $Q_{22}$. In the description below, a case will be described of an SJ-MOS in which the p-type columns 12a, 12b and the n-type columns 11a, 11b, 11c are alternately formed in a repeating manner.

In regions located above the p-type columns 12a, 12b in the drift region 11, p-type well regions 13a, 13b are repeatedly disposed in plurality, forming a multichannel structure. P-type contact regions 14a, 14b are disposed on top of the well regions 13a, 13b, and n-type source regions 15a, 15b, 15c, 15d are repeatedly arranged in plurality so as to sandwich the contact regions 14a, 14b, thereby allowing a large of amount of current to flow. Gate electrodes 17a, 17b, 17c are arranged on the n-type columns 11a, 11b, 11c with a gate insulation film 16 interposed therebetween. An interlayer insulating film 18 is formed so as to cover the gate insulation film 16. A source electrode 19 is arranged so as to contact the contact regions 14a, 14b and the source regions 15a, 15b, 15c, 15d. A drain region 10 is disposed below the p-type columns 12a, 12b and the n-type columns 11a, 11b, 11c, and a drain electrode 20 is disposed on the bottom surface of the drain region 10, thereby forming the SJ-MOS.

Figure 3:
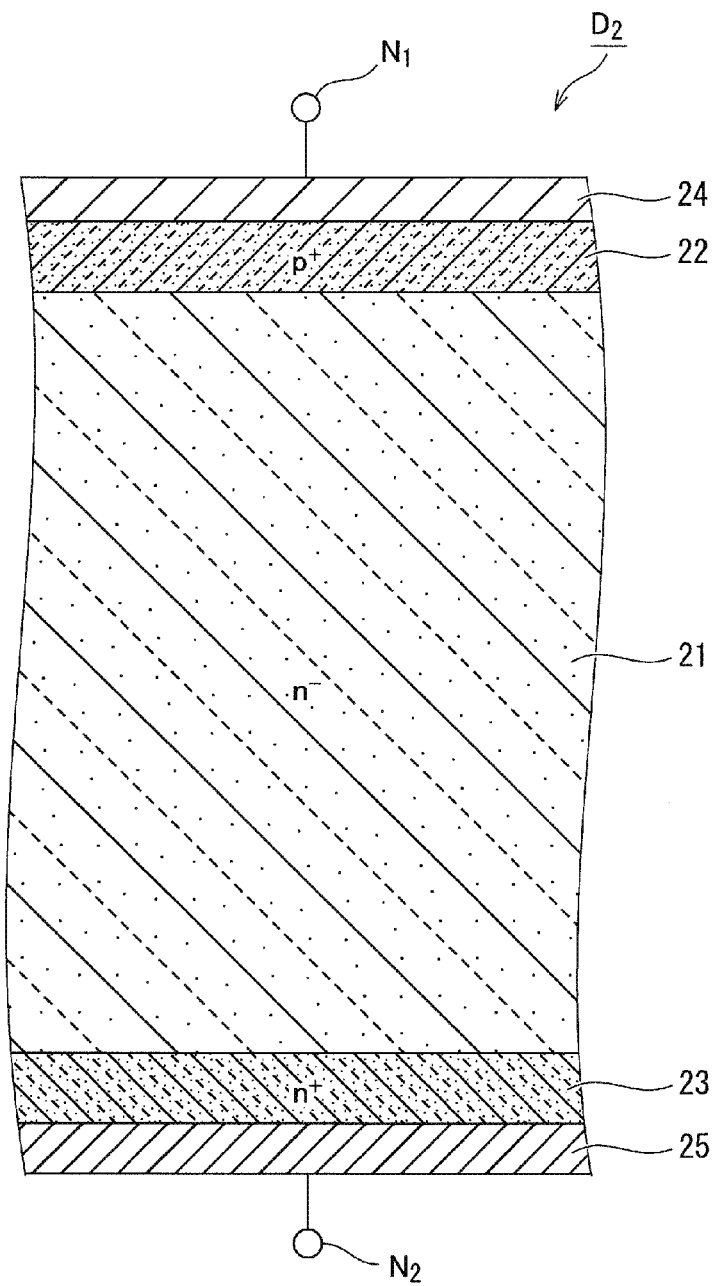
FIG. 3 is a cross-sectional view that shows one example of a protection diode according to an embodiment of the present invention.

As shown in FIG. 3, for example, the protection diode $D_2$ of the protection circuit 102 shown in FIG. 1 is a PIN diode that includes: an n⁻ drift region 21; a p⁺ anode region 22 that is disposed on the top surface of the drift region 21; and an n-type cathode region 23 that is disposed on the rear surface of the drift region 21 and has a higher impurity density than the drift region 21. An anode electrode 24 is disposed on the top surface of the anode region 22. Meanwhile, a cathode electrode 25 is disposed on the rear surface of a cathode region 23.

Figure 4:
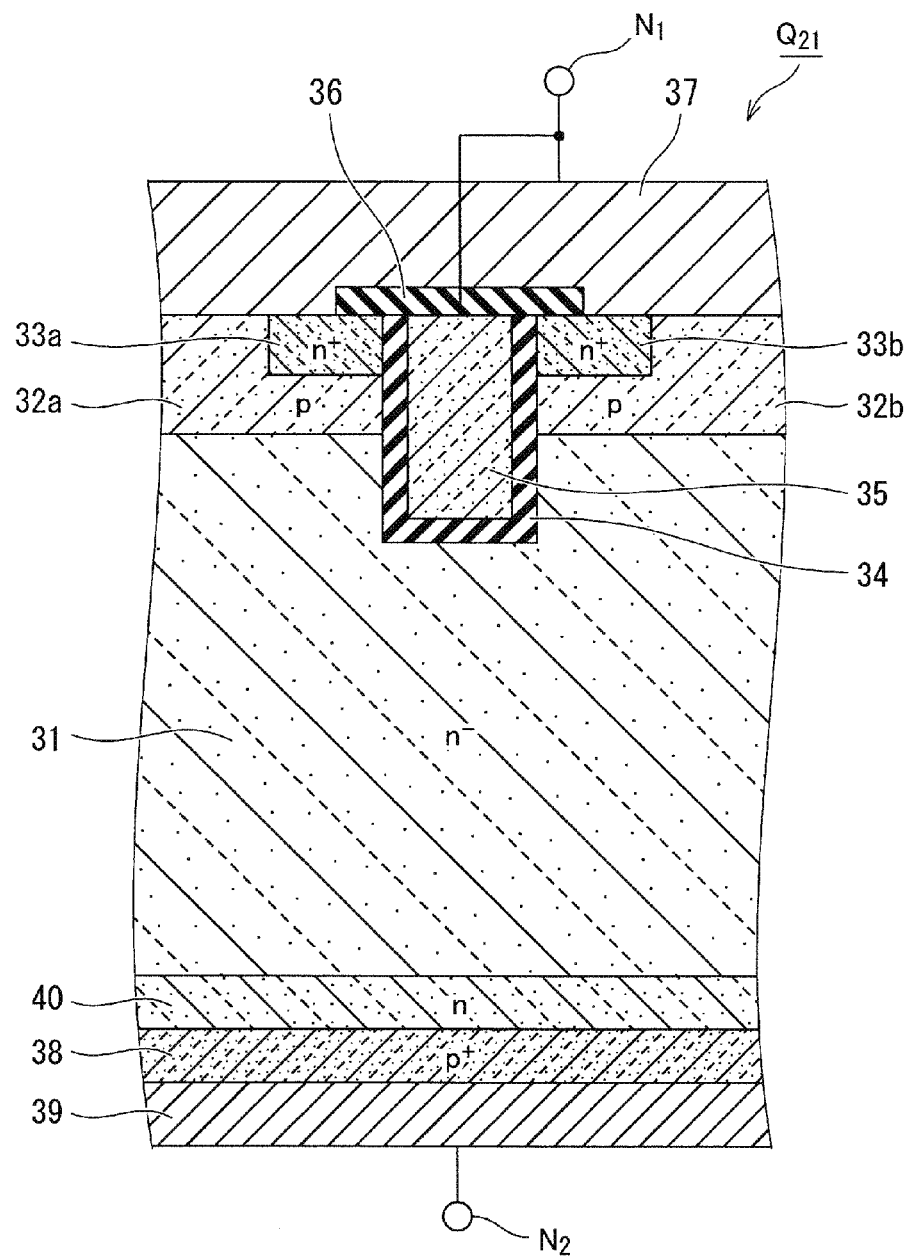
FIG. 4 is a cross-sectional view that shows one example of a bipolar protection element (an IGBT) in a protection circuit according to an embodiment of the present invention.

As shown in FIG. 4, which shows a portion of the bipolar protection element $Q_{21}$ of the protection circuit 102 shown in FIG. 1, the bipolar protection element $Q_{21}$ is an IGBT that has a single trench gate structure, for example. P-type base regions 32a, 32b are disposed on the upper surface side of an n⁻ drift region 31 as a single structure, and this single structure is arranged repeatedly, forming a multichannel structure. N⁺ emitter regions 33a, 33b that have a higher impurity density than the drift region 31 are repeatedly arranged on top of the base regions 32a, 32b. Gate electrodes 35 are repeatedly embedded in the inner surface of recesses (trenches) that pass through the base regions 32a, 32b and reach the top of the drift region 31, with a gate insulation film 34 interposed therebetween. Emitter electrodes 37 are repeatedly arranged on the gate electrodes 35 with an interlayer insulating film 36 interposed therebetween. The emitter electrode 37 contacts the emitter regions 33a, 33b and the base regions 32a, 32b. An n-type field stop (FS layer) 40 that has a higher impurity density than the drift region 31 is disposed on the rear surface side of the drift region 31, and a p-type collector region 38 is disposed on the rear surface side of the FS layer 40. A collector electrode 39 is disposed on the rear surface of the collector region 38.

The bipolar power switching element $Q_{11}$, unipolar power switching element $Q_{12}$, and freewheeling diode $D_1$ of the switching circuit 101 shown in FIG. 1, and the bipolar protection element $Q_{21}$, unipolar protection element $Q_{22}$, and protection diode $D_2$ of the protection circuit 102 shown in FIG. 1 may be individual discrete devices respectively formed on one chip, for example, that are modularized by being connected by bonding wires or the like and then packaged. In addition, the bipolar power switching element $Q_{11}$, unipolar power switching element $Q_{12}$, and freewheeling diode $D_1$ of the switching circuit 101, and the bipolar protection element $Q_{21}$, unipolar protection element $Q_{22}$, and protection diode $D_2$ of the protection circuit 102 may be monolithically formed by being collectively formed on one chip.

The unipolar power switching element $Q_{12}$, freewheeling diode $D_1$, and bipolar power switching element $Q_{11}$ of the switching circuit 101 shown in FIG. 1 may respectively have the same configuration as the unipolar protection element $Q_{22}$ of the protection circuit 102 shown in FIG. 2, the protection diode $D_2$ of the protection circuit 102 shown in FIG. 3, and the bipolar protection element $Q_{21}$ of the protection circuit 102 shown in FIG. 4, respectively, or the configurations thereof may be different.

<Operation of Semiconductor Device>

Next, one example of a switching operation of a semiconductor device according to an embodiment of the present invention will be described using FIG. 1.

The description will start with when the switching circuit 101 is turned ON. The bipolar power switching element $Q_{11}$ and the unipolar power switching element $Q_{12}$ of the switching circuit 101 are turned ON in accordance with a control signal from the control circuit 100, resulting in the switching elements $Q_{11}$, $Q_{12}$ changing to a conductive state. The unipolar power switching element $Q_{12}$, which has a lower ON threshold voltage than the bipolar power switching element $Q_{11}$, is turned ON first, for example. Current flows from the power source $V_{cc}$ to the load $Z_1$ as a result of the bipolar power switching element $Q_{11}$ and the unipolar power switching element $Q_{12}$ changing to a conductive state.

Thereafter, the bipolar power switching element $Q_{11}$ and the unipolar power switching element $Q_{12}$ of the switching circuit 101 are turned OFF in accordance with a control signal from the control circuit 100, resulting in the switching elements $Q_{11}$, $Q_{12}$ changing to a blocking state. Current flowing from the power source $V_{cc}$ toward the load $Z_1$ is blocked as a result of the bipolar power switching element $Q_{11}$ and the unipolar power switching element $Q_{12}$ of the switching circuit 101 changing to a blocking state. As a result, discharge current resulting from a counter-electromotive force from the load $Z_1$ flows to the protection circuit 102, and the bipolar protection element $Q_{21}$, unipolar protection element $Q_{22}$, and protection diode $D_2$ of the protection circuit 102 consume the discharge current.

Thereafter, the bipolar power switching element $Q_{11}$ and the unipolar power switching element $Q_{12}$ of the switching circuit 101 are turned ON in accordance with a control signal from the control circuit 100, resulting in the switching elements $Q_{11}$, $Q_{12}$ changing to the conductive state. At such time, in the protection circuit 102, a reverse recovery current flows to the bipolar protection element $Q_{21}$, unipolar protection element $Q_{22}$, and protection diode $D_2$ of the protection circuit 102 during reverse recovery when current transitions from forward to reverse.

Figure 5:
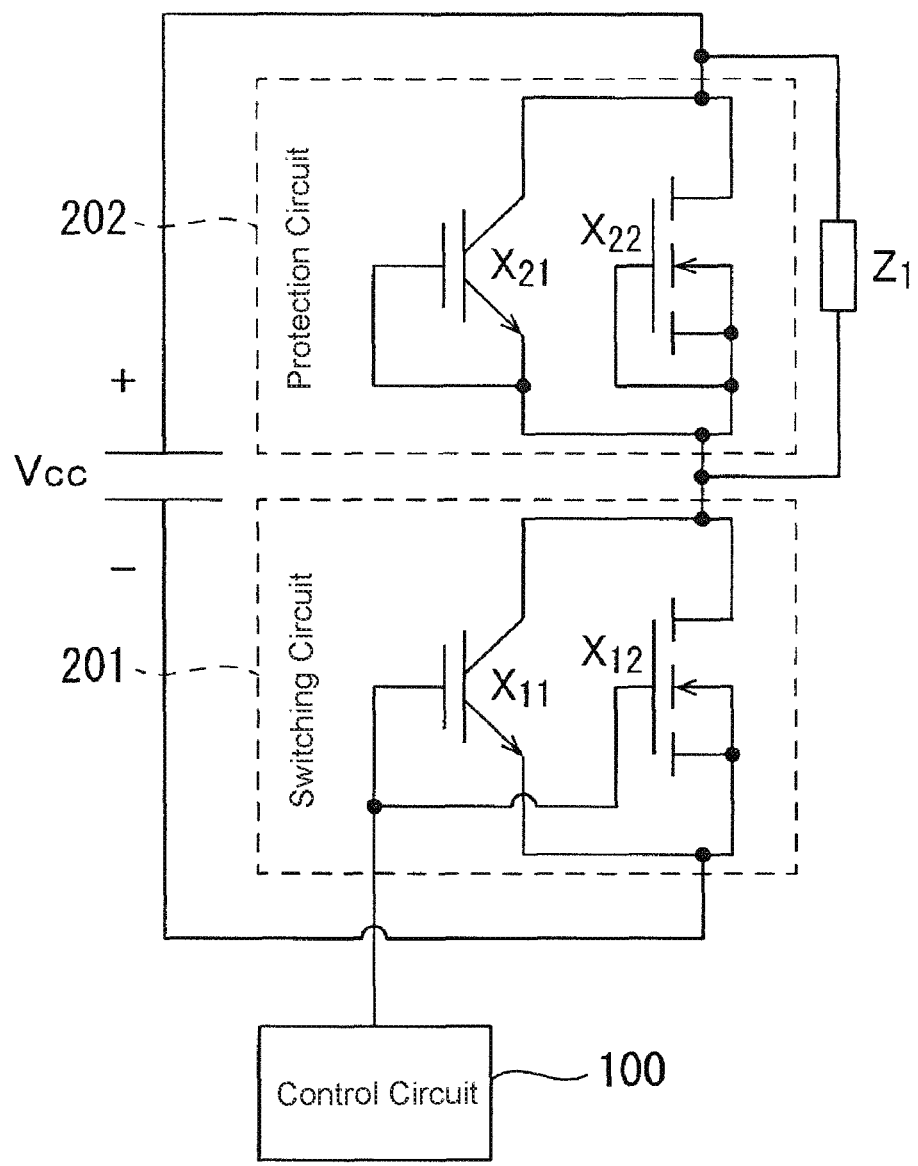
FIG. 5 is a circuit diagram that shows one example of a semiconductor device according to a comparison example.

Meanwhile, as shown in FIG. 5, a semiconductor device according to a comparison example includes a switching circuit 201 and a protection circuit 202. The switching circuit 201 includes a bipolar power switching element $X_{11}$ and a unipolar power switching element $X_{12}$ connected in parallel, and differs from the semiconductor device shown in FIG. 1 in that a freewheeling diode is not connected in parallel. Meanwhile, the protection circuit 202 includes a bipolar protection element $X_{21}$ and a unipolar protection element $X_{22}$ connected in parallel, and differs from the semiconductor device shown in FIG. 1 in that a protection diode is not connected in parallel.

Figure 6:
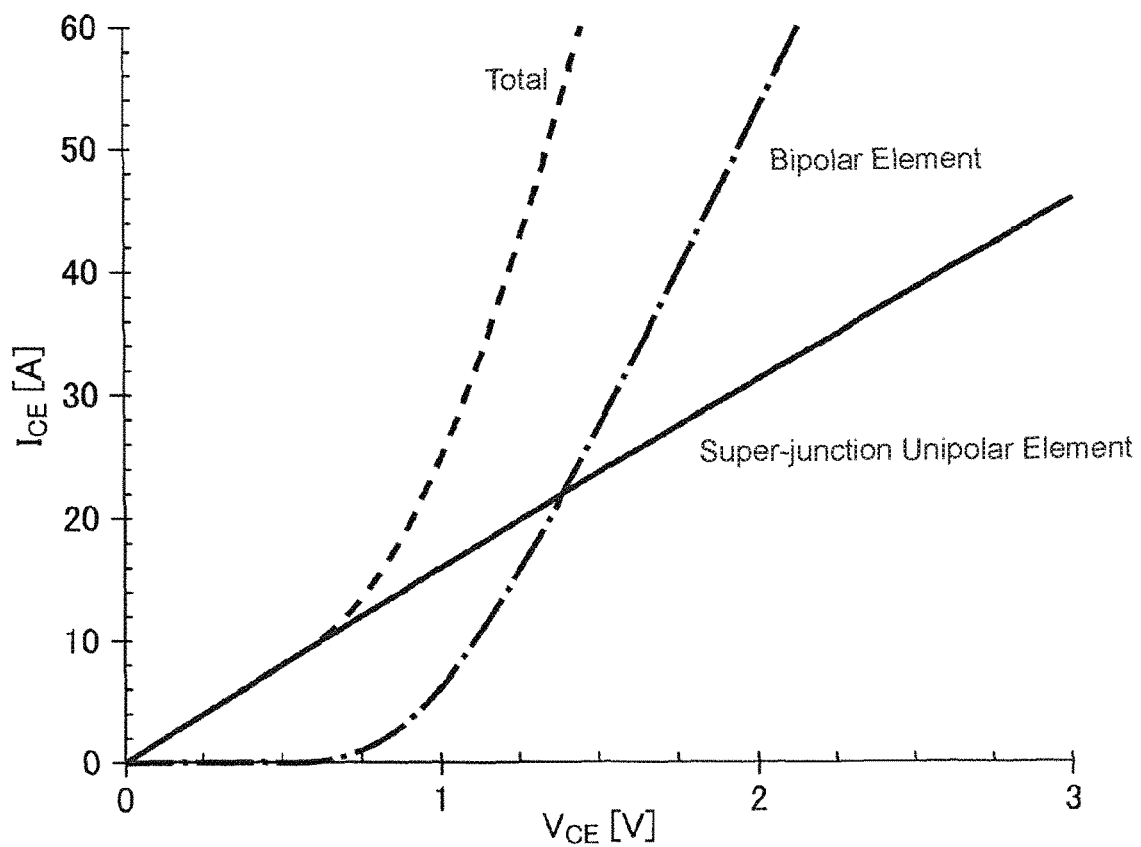
FIG. 6 is a graph that shows the current/voltage (I-V) characteristics of the semiconductor device according to the comparison example.

FIG. 6 shows the current-voltage characteristics of a super-junction unipolar element such as an SJ-MOS and a bipolar element such as an IGBT. As shown in FIG. 6, in the small-current region, the ON resistance of the super-junction unipolar element is relatively higher than the ON resistance of the bipolar element. Meanwhile, in the large-current region, the ON resistance of the bipolar element is relatively higher than the ON resistance of the super-junction unipolar element. Thus, in the protection circuit 202 of the semiconductor device according to the comparison example, discharge current flows in the small-current region of approximately several amperes as a result of the unipolar protection element $X_{22}$ being turned ON. Meanwhile, for large amounts of current of approximately several hundred amperes, such as when a motor is being operated at full capacity, for example, discharge current flows as a result of the bipolar protection element $X_{21}$ being turned ON.

Figure 7:
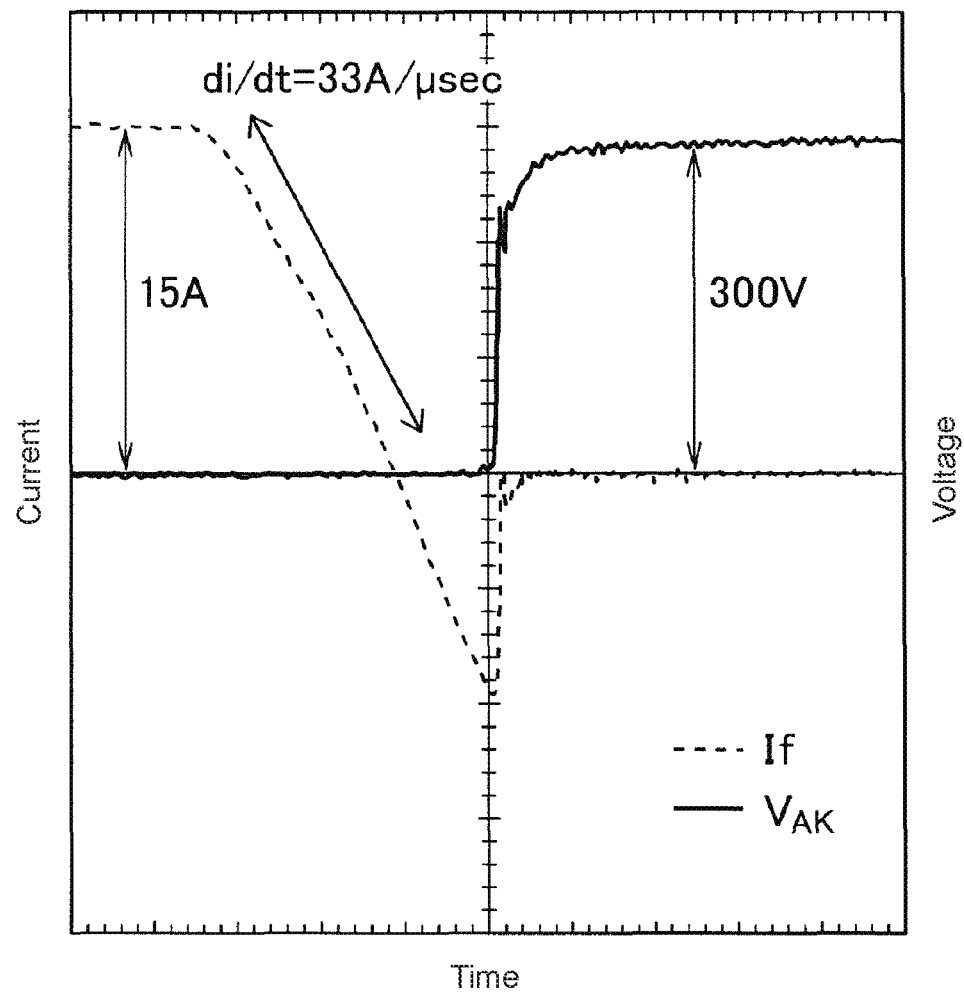
FIG. 7 is a graph that shows current and voltage during reverse recovery in a unipolar protection element according to the comparison example.

In the semiconductor device according to the comparison example, particularly when the unipolar protection element $X_{22}$ is an SJ-MOS like that shown in FIG. 2, the distance between the p-type columns 12a, 12b and the n-type columns 11a, 11b, 11c is small; thus, the depletion layer spreads quickly, and there is a sharp overshoot in voltage during reverse recovery of the body diode of the SJ-MOS, resulting in hard switching. There is a high probability that the unipolar protection element $X_{22}$ will be damaged as a result of the amount of energy in this surge voltage and a reverse recovery peak current $I_{rp}$, and the breakdown resistance during reverse recovery will decrease. As shown in FIG. 7, in order to suppress the reverse recovery peak current $I_{rp}$ and overshoots in the surge voltage, it is possible to make di/dt, which is the rate of decrease in current during reverse recovery, smaller (by setting di/dt to 33 A/μsec, for example). However, when di/dt becomes smaller, di/dt when the unipolar protection element $X_{22}$ is turned ON becomes smaller, and turn-on losses $E_{on}$ increase. As a result, such a configuration is not preferable.

As a countermeasure, in the semiconductor device according to an embodiment of the present invention, a protection diode $D_2$ is connected in parallel in the protection circuit 102; thus, it is possible to distribute and pass some of the discharge current from the load $Z_1$ to the protection diode $D_2$. The current distribution ratio between the unipolar protection element $Q_{22}$ and the protection diode $D_2$ is determined by the relative relationship between the forward drop voltage $V_{fq}$ of the unipolar protection element $Q_{22}$ and the forward drop voltage $V_{fd}$ of the protection diode $D_2$. In the semiconductor device according to an embodiment of the present invention, the forward drop voltage $V_{fq}$ of the unipolar protection element $Q_{22}$ is set so as to be relatively higher than the forward drop voltage $V_{fd}$ of the protection diode $D_2$. As a result, it is possible to make the current distribution ratio of the unipolar protection element $Q_{22}$ during reverse recovery relatively small, suppress sharp overshoots in the voltage of the unipolar protection element $Q_{22}$ during reverse recovery, and increase breakdown resistance.

In a normal SJ-MOS, since the width of the n-type columns 11a, 11b, 11c is narrow, the drift resistance is extremely low; thus, holes in the p-type columns 12a, 12b tend to accumulate, and the forward drop voltage $V_{fq}$ of the SJ-MOS tends to be lower. Meanwhile, the drift region 211 in the protection diode $D_2$ is large, and the drift resistance is higher than in the SJ-MOS. Furthermore, since there are no n-type columns, holes flow directly from the element front surface to the rear surface. Therefore, there is normally a tendency for the forward drop voltage $V_{fq}$ of the SJ-MOS used in the unipolar protection element $Q_{22}$ to be lower than the forward drop voltage $V_{fd}$ of the protection diode $D_2$.

As a countermeasure, according to an embodiment of the present invention, the forward drop voltage $V_{fq}$ of the SJ-MOS forming the unipolar protection element $Q_{22}$ is intentionally set so as to be relatively higher than the forward drop voltage $V_{fd}$ of the protection diode $D_2$. For example, during the manufacturing process of the unipolar protection element $Q_{22}$, it is possible to set the forward drop voltage $V_{fq}$ of the unipolar protection element $Q_{22}$ so as to be relatively higher than the forward drop voltage $V_{fd}$ of the protection diode $D_2$ by irradiating the unipolar protection element $Q_{22}$ with a particle beam such as an electron beam, thereby shortening the lifetime, and increasing the forward drop voltage $V_{fq}$ of the unipolar protection element $Q_{22}$. In addition, during the manufacturing process of the protection diode $D_2$, the forward drop voltage $V_{fd}$ of the protection diode $D_2$ may be adjusted by irradiating the protection diode $D_2$ with a particle beam such as an electron beam.

In addition, even if the drift resistance of the SJ-MOS is increased, it is possible to set the forward drop voltage $V_{fq}$ of the SJ-MOS so as to be relatively higher than the forward drop voltage $V_{fd}$ of the protection diode $D_2$. It is also possible to decrease the forward drop voltage $V_{fd}$ of the protection diode $D_2$ and set the forward drop voltage $V_{fq}$ of the SJ-MOS forming the unipolar protection element $Q_{22}$ so as to be relatively higher than the forward drop voltage $V_{fd}$ of the protection diode $D_2$ by increasing the chip size of the protection diode $D_2$ or making the protection diode $D_2$ thinner. Furthermore, the unipolar protection element $Q_{22}$ and the protection diode $D_2$ may be formed of different materials, such as having the unipolar protection element $Q_{22}$ be formed using an SiC material while the protection diode $D_2$ is formed using an Si material. By combining the above-mentioned steps, it is possible to set the forward drop voltage $V_{fq}$ of the unipolar protection element $Q_{22}$ so as to be relatively higher than the forward drop voltage $V_{fd}$ of the protection diode $D_2$.

It is preferable that a difference $\Delta V_f$ (hereafter abbreviated as just $\Delta V_f$), in which the forward drop voltage $V_{fd}$ of the protection diode $D_2$ has been subtracted from the forward drop voltage $V_{fq}$ of the unipolar protection element $Q_{22}$, be greater than 0 and less than or equal to 15V. If $\Delta V_f$ is less than or equal to 15V, it is possible to suppress increases in cost associated with an increase in the chip size of the protection diode $D_2$ and to prevent deterioration of the ON resistance of the unipolar protection element $Q_{22}$ to within an acceptable range. The forward drop voltage $V_{fd}$ of the protection diode $D_2$ is approximately 0.5V to 1.5V (for example, 0.6V if the diode is an Si diode), for example, and the forward drop voltage $V_{fq}$ of the unipolar protection element $Q_{22}$ is approximately 0.5V to 15V, for example. The present invention is not limited to this, however, and it is possible to appropriately set these values.

Working Examples

Figure 8:
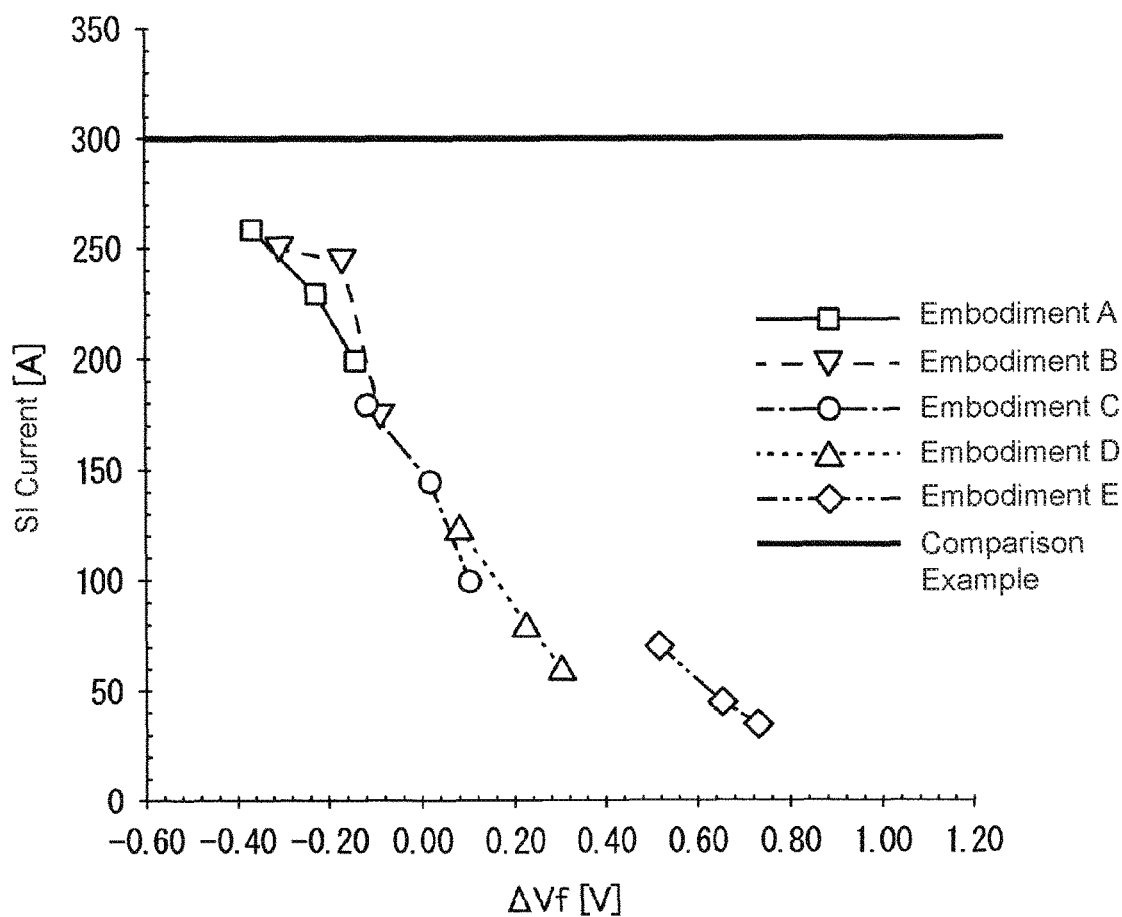
FIG. 8 is a graph that shows the relationship between the current flowing to a unipolar protection element and a difference $\Delta V_f$ between a forward drop voltage of the unipolar protection element and a forward drop voltage of a protection diode in semiconductor devices according to working examples, as well as values for the comparison example.

Next, simulations were conducted in which semiconductor devices associated with Working Examples A to E were created, and the relationship between $\Delta V_f$ and the current flowing to the SJ-MOS forming the unipolar protection element $Q_{22}$ was calculated. The forward drop voltages $V_{fq}$ of the unipolar protection elements $Q_{22}$ in Working Examples A to E were set so as to increase in the following ascending order from Working Example A to Working Example E: 0.78V, 1V, 1.92V, 2.97V, and 4.62V. Furthermore, while the forward drop voltage $V_{fq}$ of the unipolar protection element $Q_{22}$ was kept constant for each of the Working Examples A to E, three different values of 1.28V, 1.05V, and 0.91V were set for the forward drop voltage $V_{fd}$ of the protection diode $D_2$ for each working example. FIG. 8 shows the calculated results in Working Examples A to E for the relationship between $\Delta V_f$ and the current (SJ current) flowing to the SJ-MOS forming the unipolar protection element $Q_{22}$. As shown in FIG. 8, as $\Delta V_f$ becomes larger, the current distribution ratio of the protection diode $D_2$ increases; thus, it can be seen that there is a decrease in the amount of current (SJ current) flowing to the unipolar protection element $Q_{22}$.

Figure 9:
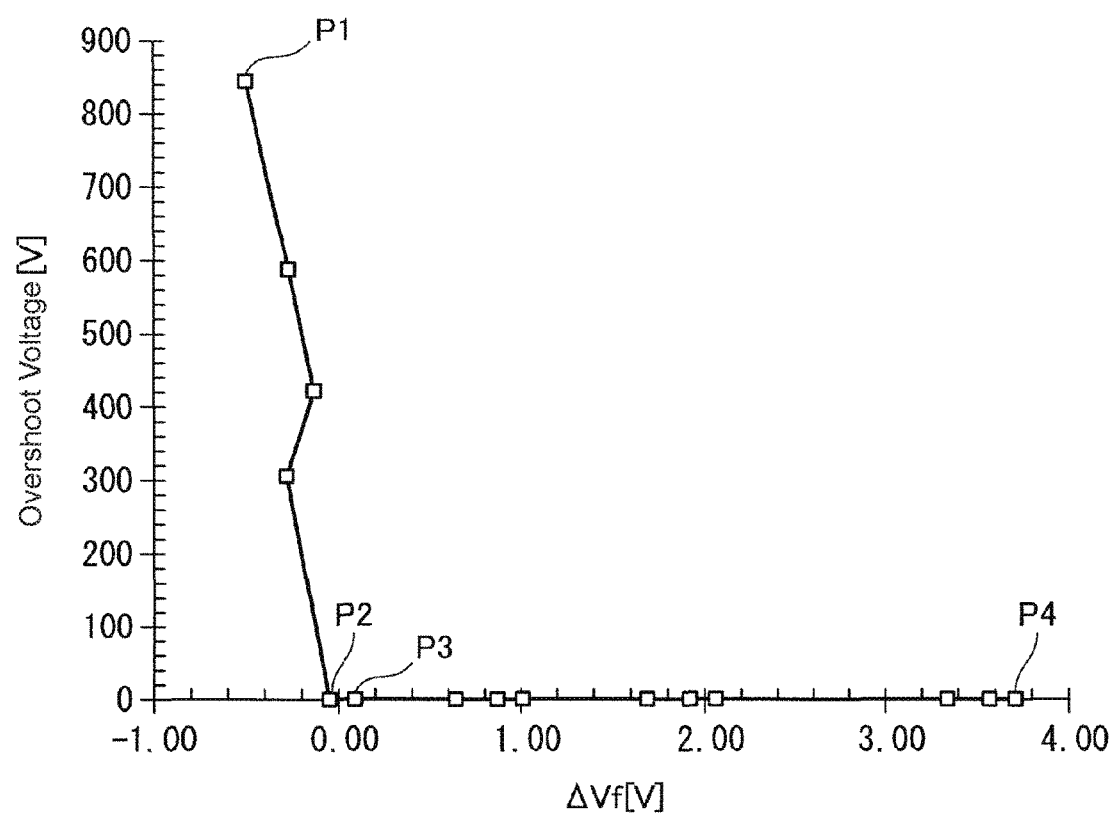
FIG. 9 is a graph that shows the relationship between an overshoot voltage of a body diode of the unipolar protection element and the difference $\Delta V_f$ between the forward drop voltage of the unipolar protection element and the forward drop voltage of the protection diode in semiconductor devices according to the working examples.

Furthermore, simulations were conducted using Working Examples A to E in which the relationship between $\Delta V_f$ and the overshoot voltage in the body diode during reverse recovery for the unipolar protection element $Q_{22}$ was calculated. The simulation conditions were set such that the gate resistance was fixed, the bus voltage was 300V, the current was 300 A, and the rate of decrease in the reverse recovery current, di/dt, was 3 kA/μsec. FIG. 9 shows the calculated results for the relationship between $\Delta V_f$ and the overshoot voltage of the body diode of the unipolar protection element $Q_{22}$ in the protection circuit 102. Furthermore, FIGS. 10 to 13 respectively show the calculated results for voltage and current during reverse recovery for the sample points P1 to P4 in FIG. 9. As shown in FIGS. 9 to 13, as $\Delta V_f$ becomes larger, the overshoot voltage during reverse recovery decreases, and as $\Delta V_f$ becomes larger than 0, the overshoot voltage is substantially suppressed.

Figure 10:
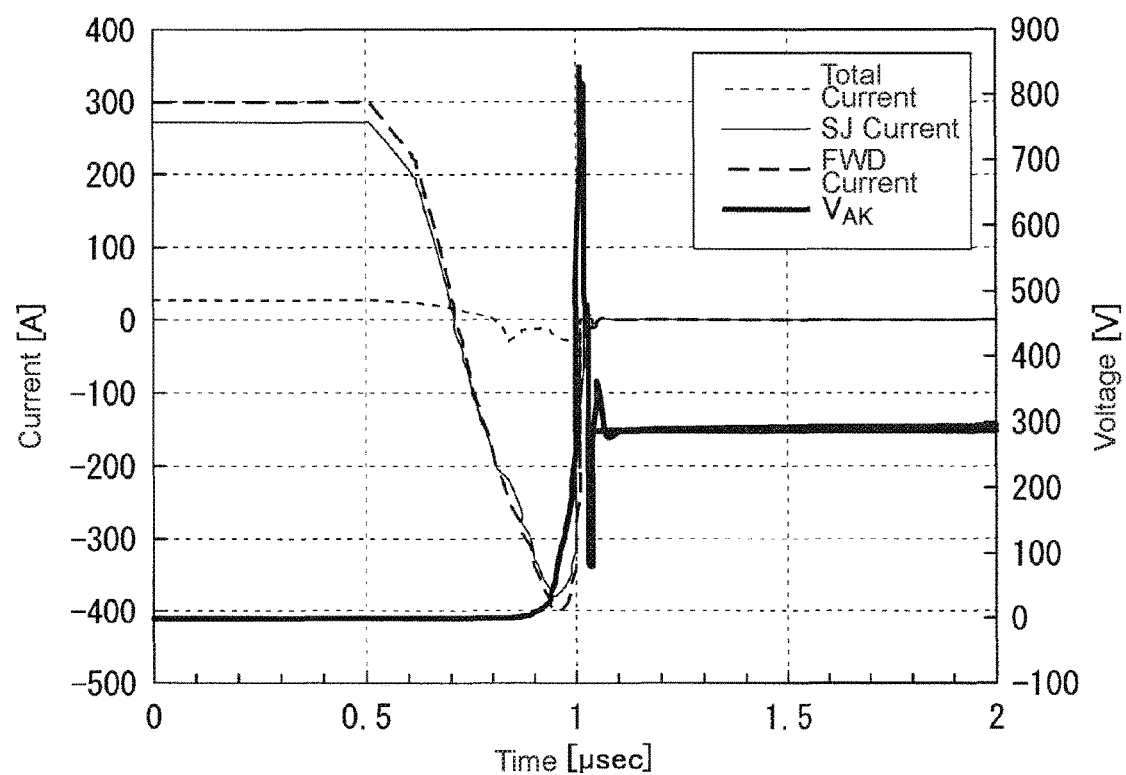
FIG. 10 is a graph (the first of multiple graphs) that shows the current and voltage during reverse recovery of a protection diode and a unipolar protection element in a semiconductor device according to a working example.
Figure 11:
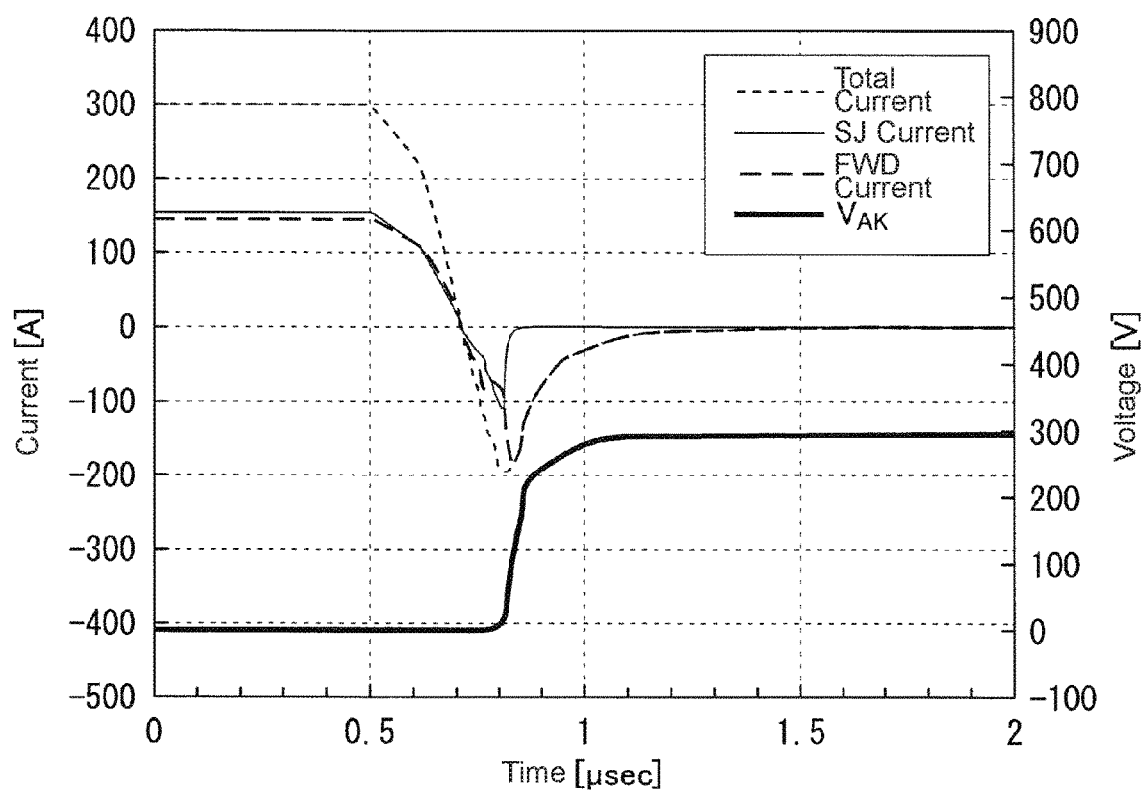
FIG. 11 is a graph (the second of multiple graphs) that shows the current and voltage during reverse recovery of a protection diode and a unipolar protection element in a semiconductor device according to a working example.
Figure 12:
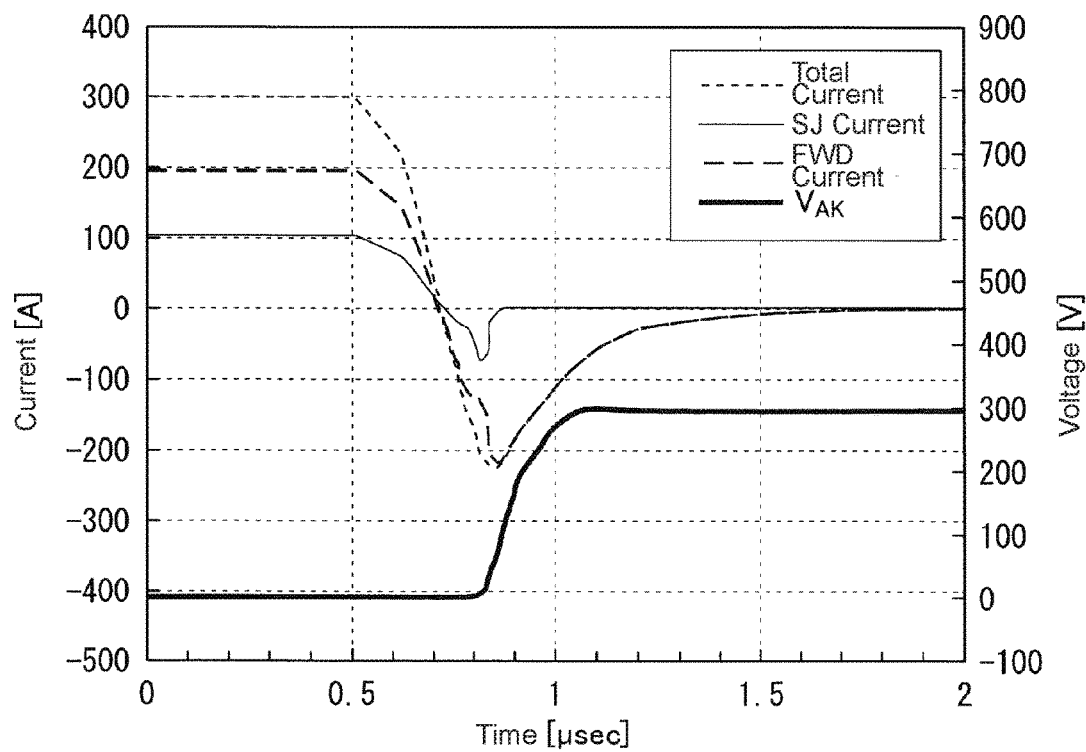
FIG. 12 is a graph (the third of multiple graphs) that shows the current and voltage during reverse recovery of a protection diode and a unipolar protection element in a semiconductor device according to a working example.
Figure 13:
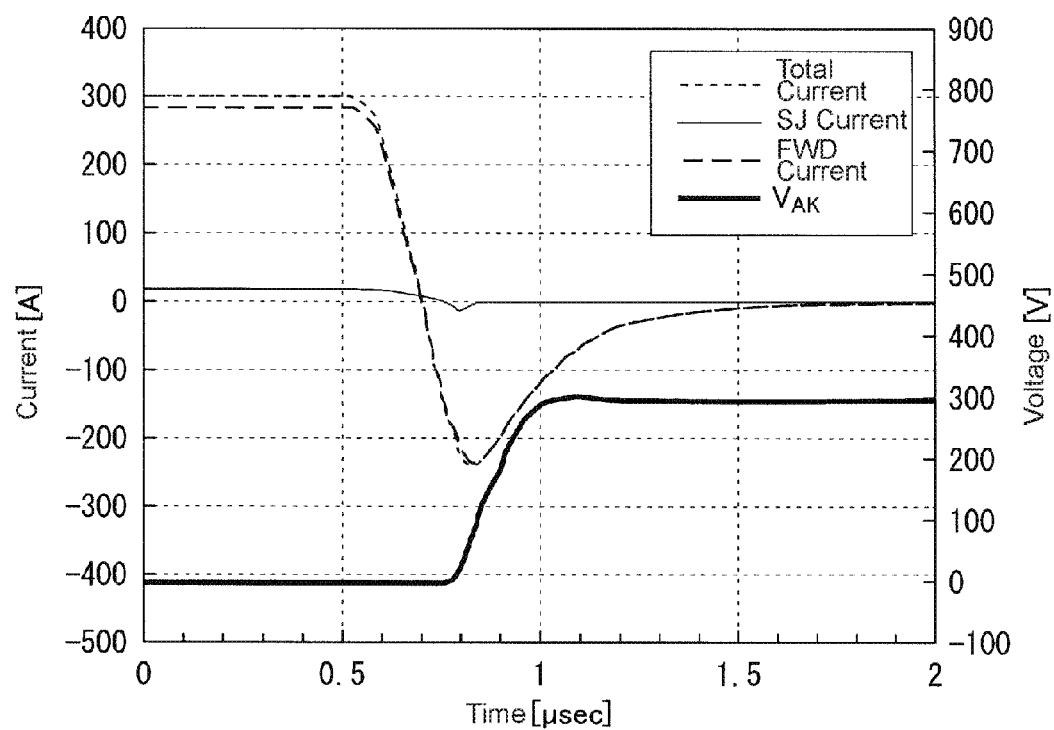
FIG. 13 is a graph (the fourth of multiple graphs) that shows the current and voltage during reverse recovery of a protection diode and a unipolar protection element in a semiconductor device according to a working example.

As shown in FIG. 10, when $\Delta V_f$ is negative, there is a sharp overshoot in the voltage $V_{AK}$ of the body diode of the unipolar protection element $Q_{22}$. Thus, this surge voltage is large, and it is more likely that damage will occur during reverse recovery. As a countermeasure, as shown in FIGS. 11 to 13, when $\Delta V_f$ is large, even though the reverse recovery current (SJ current) of the unipolar protection element $Q_{22}$ returns to zero, current continues to flow to the protection diode $D_2$ side; thus, the voltage of the unipolar protection element $Q_{22}$ will not increase. Then, as the current to the protection diode $D_2$ side returns to zero, there is a soft rise in the voltage $V_{AK}$ on the protection diode $D_2$ side. Therefore, by increasing the rate of decrease in the reverse recovery current, di/dt, the voltage $V_{AK}$ will softly rise even if there is an increase in the reverse recovery peak current $I_{rp}$; thus, breakdown resistance can be increased. As a result, when a large amount of current of approximately several hundred amperes is flowing, even if the rate of decrease in the reverse recovery current, di/dt, is made larger to reduce switching losses Err, it is possible to increase breakdown resistance.

Figure 14:
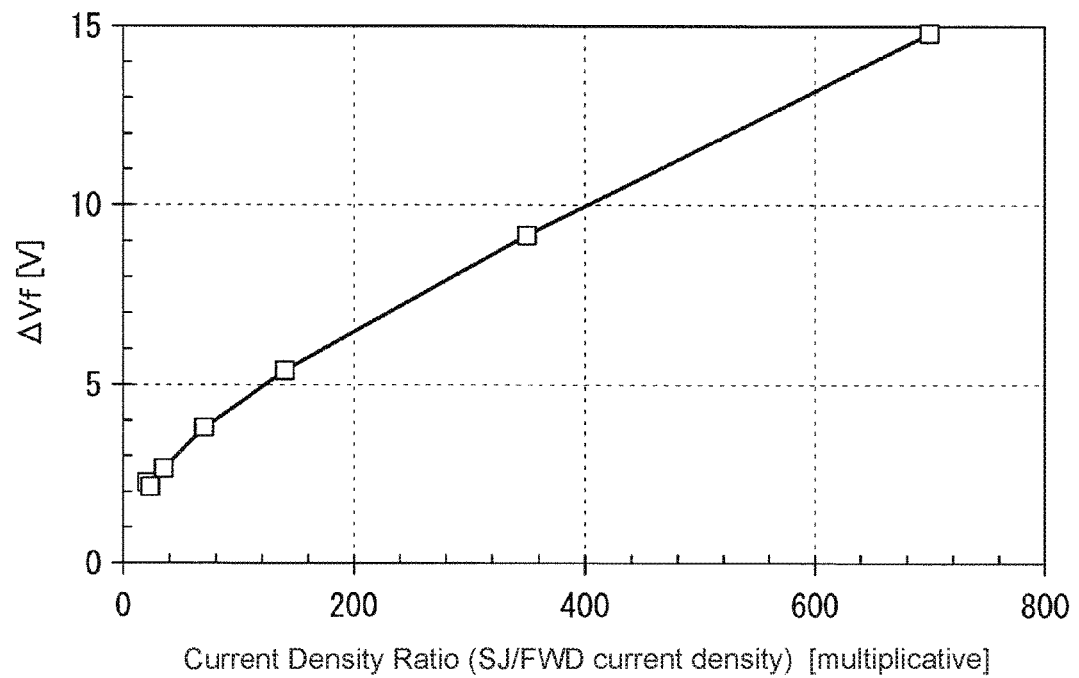
FIG. 14 is a graph that shows the relationship between the current density ratio and the difference $\Delta V_f$ between the forward drop voltage of the unipolar protection element and the forward drop voltage of the protection diode in semiconductor devices according to the working examples.

FIG. 14 shows the calculated results of $\Delta V_f$ for a static characteristic during the simulations. It can be seen that when the current density of the unipolar protection element $Q_{22}$ is increased to 700 times the current density of the protection diode $D_2$, it is possible to set $\Delta V_f$ to 15V. It is possible to adjust the difference in current density by making the chip size of the protection diode $D_2$ larger and making the chip size of the unipolar protection element $Q_{22}$ smaller, for example. It is preferable that the current density of the unipolar protection element $Q_{22}$ be less than or equal to 700 times the current density of the protection diode $D_2$ in order to suppress deterioration of the ON resistance of the unipolar protection element $Q_{22}$ and to prevent increases in the costs associated with the protection diode $D_2$.

In a semiconductor device according to an embodiment of the present invention as described above, as shown in FIG. 1, by connecting the bipolar protection element $Q_{21}$, the unipolar protection element $Q_{22}$, and the protection diode $D_2$ in parallel in the protection circuit 102, it is possible to distribute current flowing to the unipolar protection element $Q_{22}$ to the protection diode $D_2$ compared to a case in which there is no protection diode $D_2$. Thus, it is possible to increase the life of the unipolar protection element $Q_{22}$. Furthermore, by making the forward drop voltage $V_{fq}$ of the unipolar protection element $Q_{22}$ higher than the forward drop voltage $V_{fd}$ of the protection diode $D_2$, it is possible to prevent overshoots in the surge voltage of the unipolar protection element $Q_{22}$ during reverse recovery by decreasing the current distribution ratio of the unipolar protection element $Q_{22}$. As a result, it is also possible to increase the breakdown resistance of the unipolar protection element $Q_{22}$.

<Manufacturing Method of Unipolar Protection Element>

Next, one example of a manufacturing method of the SJ-MOS utilized in the unipolar protection element $Q_{22}$ used in the semiconductor device according to an embodiment of the present invention will be explained using FIGS. 15A to 18B. The manufacturing method of the semiconductor device described below is one example, and it is possible to realize the semiconductor device using other types of manufacturing methods as long as these methods fall within the scope set forth in the claims.

Figure 15A:
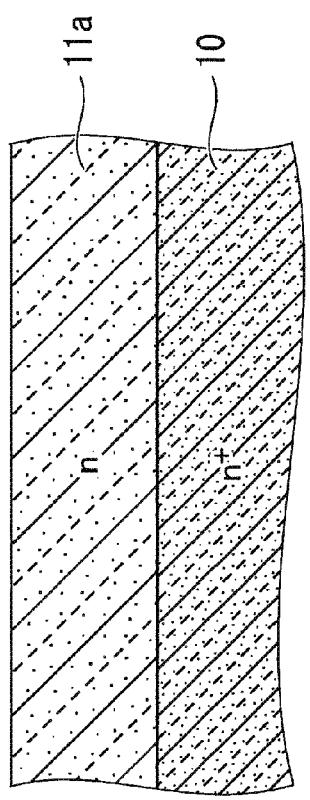
FIGS. 15A to 15C are cross-sectional views of steps that show one example of a manufacturing method of a unipolar protection element according to an embodiment of the present invention.
Figure 15B:
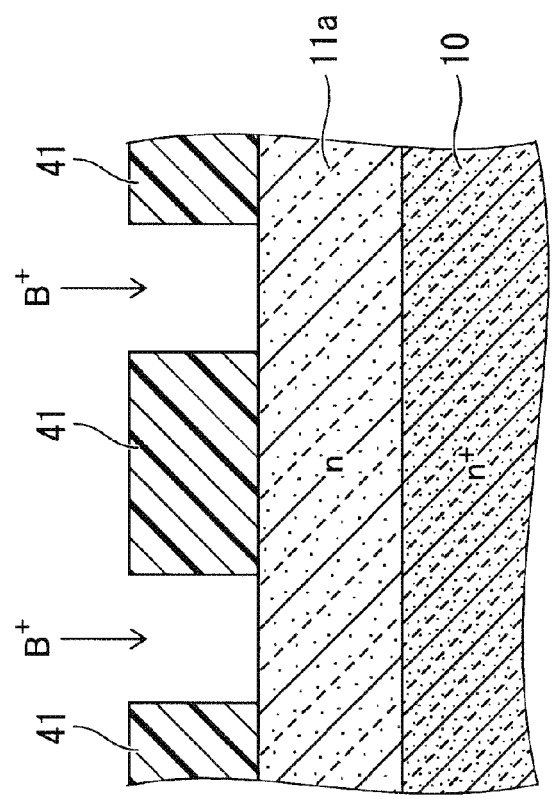

(a) As shown in FIG. 15A, an n-type epitaxial layer 11a is grown on an n-type semiconductor substrate 10 formed of monocrystalline Si. Next, a photoresist film 41 is coated onto the epitaxial layer 11a, and the photoresist film 41 is patterned using photolithography technology. As shown in FIG. 15B, ion implantation is used to selectively implant p-type impurities such as boron (B) from the top of the epitaxial layer 11a using the patterned photoresist film 41 as a mask. The remaining photoresist film 41 is removed via a removal solution, ashing, or the like. While not shown in the drawings, the photoresist film may be patterned using photolithography technology, and further ion implantation may be used to selectively implant n-type impurities into regions that will become n-type columns by using the patterned photoresist film as a mask.

Figure 15C:
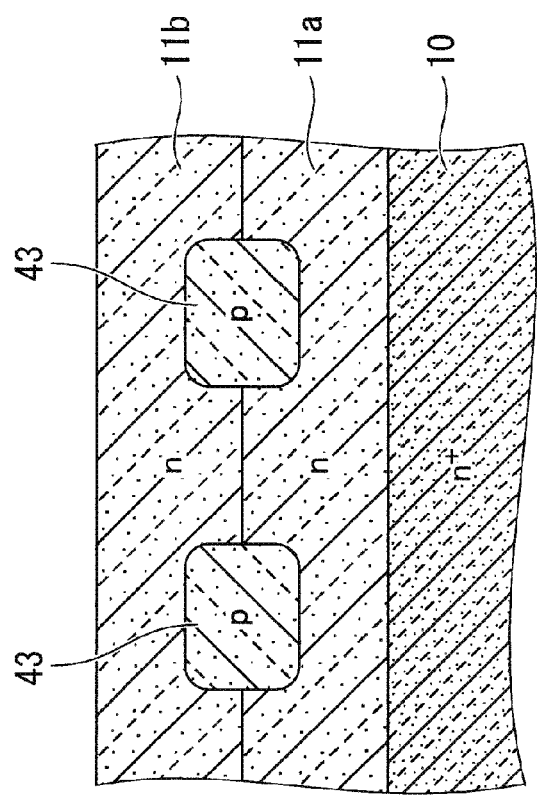
Figure 16B:
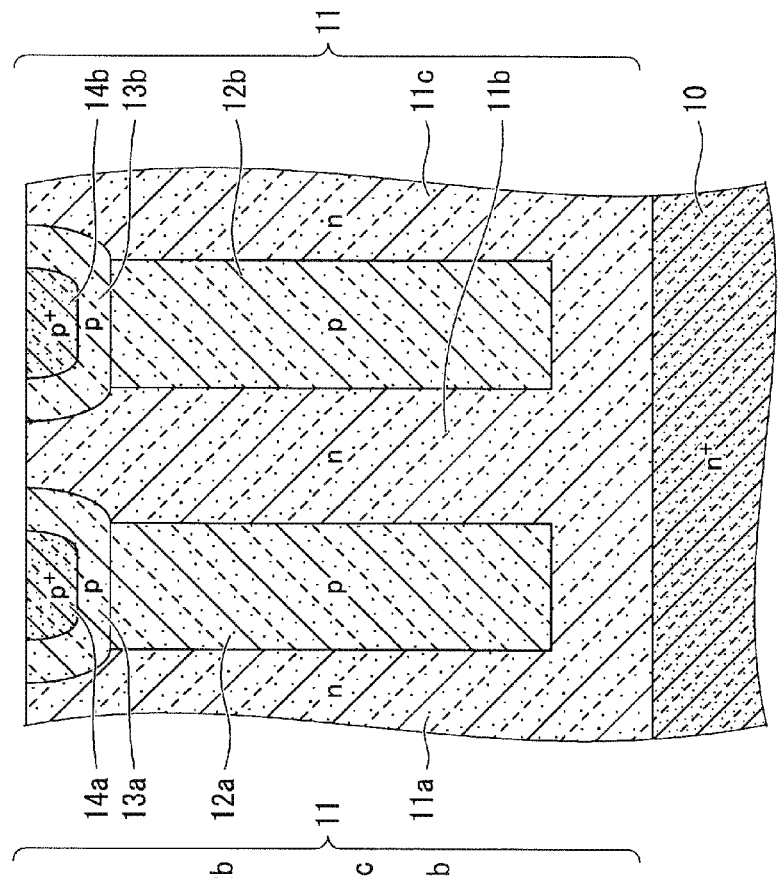
FIGS. 16A and 16B are cross-sectional views of steps after that of FIG. 15C that show one example of a manufacturing method of a unipolar protection element according to an embodiment of the present invention.
Figure 16A:
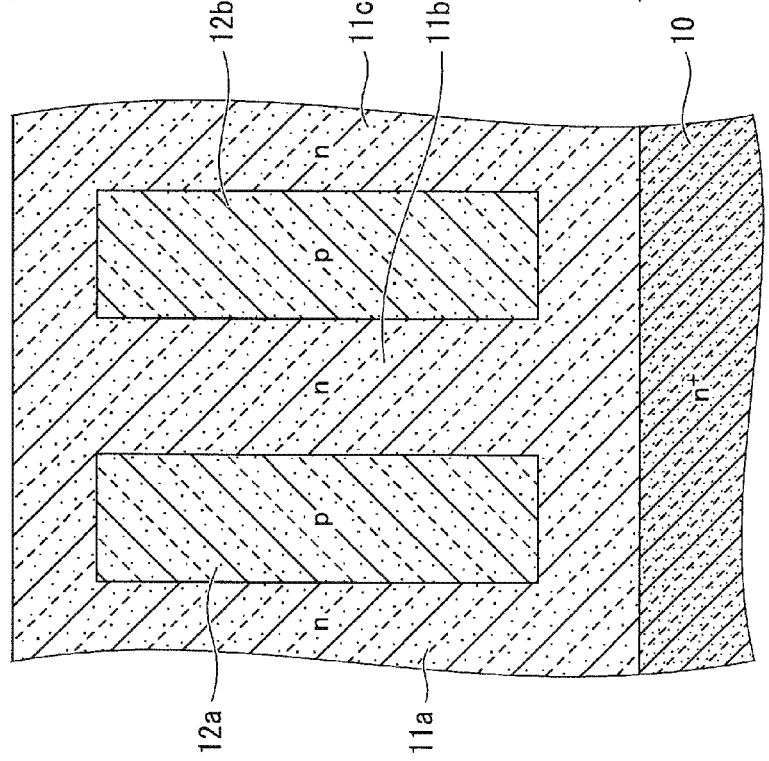

(b) Next, as shown in FIG. 15C, when an n-type epitaxial layer 11b is grown on the epitaxial layer 11a, the implanted ions are activated within the epitaxial layer 11a as a result of the epitaxial growth temperature, and the ions diffuse outward within the epitaxial layer 11b, forming p-type regions 43. If multi-epitaxy, in which similar epitaxial layer growth steps and ion implantation steps are repeated, is used, as shown in FIG. 16A, a drift region 11 is formed by the activation and outward diffusion of the implanted impurity ions so as to have a plurality of n-type columns 11a, 11b, 11c and p-type columns 12a, 12b that extend in the thickness direction of the semiconductor substrate 10 and that are alternately formed in a repeating manner. When multi-epitaxy is used, the drift region 11 is formed so as to cover the p-type columns 12a, 12b by not performing ion implantation on the topmost epitaxial layer.

(c) Next, a photoresist film is coated onto the top surface of the drift region 11, and the photoresist film is patterned using photolithography technology. Ion implantation is used to selectively implant p-type impurities such as boron (B) into the front surface of the drift region 11 using the patterned photoresist film as a mask. The remaining photoresist film is removed via a removal solution, ashing, or the like. In a similar manner, another photoresist film is coated onto the top surface of the drift region 11, and the photoresist film is patterned using photolithography technology. Ion implantation is used to selectively implant p-type impurities such as B into the front surface of the drift region 11 using the patterned photoresist film as a mask. Thereafter, as shown in FIG. 16B, p-type well regions 13a, 13b are formed in locations above the p-type columns 12a, 12b of the drift region 11 and $p^+$ contact regions 14a, 14b are formed above the well regions 13a, 13b by performing heat treatment.

Figures 17A, 17B:
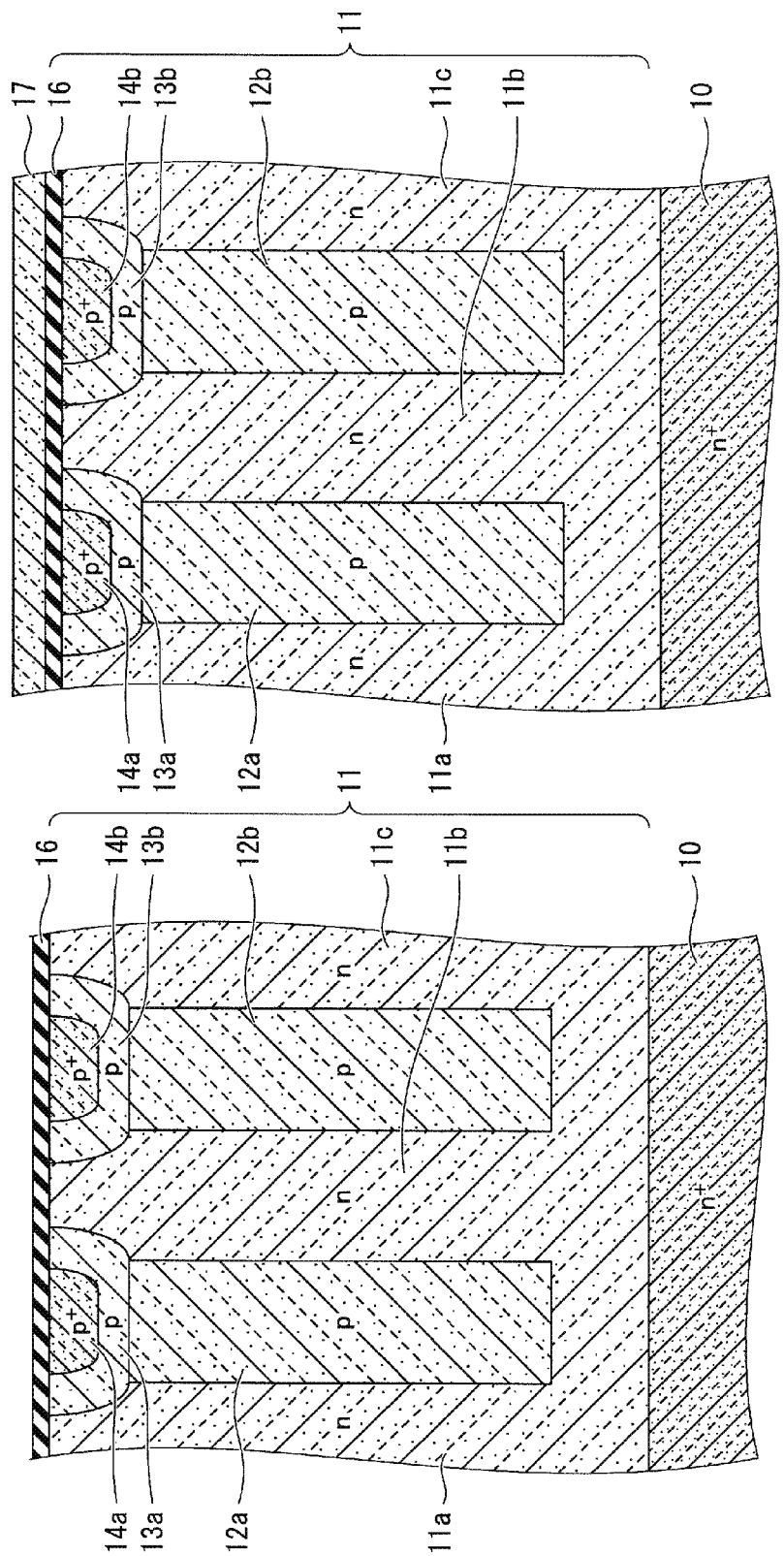
FIGS. 17A and 17B are cross-sectional views of steps after that of FIG. 16B that show one example of a manufacturing method of a unipolar protection element according to an embodiment of the present invention.

(d) Next, the treated base on which the well regions 13a, 13b and the contact regions 14a, 14b have been formed is washed, after which the front surface of the drift region 11, well regions 13a, 13b, and contact regions 14a, 14b is thermally oxidized, thereby forming, as shown in FIG. 17A, a gate insulation film 16 formed of a silicon oxide film ($SiO_2$ film). Then, as shown in FIG. 17B, a polysilicon layer (doped polysilicon layer) 17 that has been doped with n-type impurities is deposited onto the gate insulation film 16 using chemical vapor deposition (CVD) or the like. Next, as shown in FIG. 18A, photolithography technology, dry etching, or the like is used to selectively remove a portion of the gate insulation film 16 and the polysilicon layer 17, thereby exposing the well regions 13a, 13b and contact regions 14a, 14b, and forming gate electrodes 17a, 17b, 17c.

(e) Next, a photoresist film is coated onto the top surface of the gate electrodes 17a, 17b, 17c, well regions 13a, 13b, and contact regions 14a, 14b, and the photoresist film is patterned using photolithography technology. Ion implantation is used to selectively implant n-type impurities such as P using the patterned photoresist film as a mask. The remaining photoresist film is removed using hydrofluoric acid or the like. Thereafter, as shown in FIG. 18B, n⁺ source regions 15a, 15b, 15c, 15d are formed by performing heat treatment so as to sandwich the contact regions 14a, 14b.

(f) Next, an interlayer insulating film formed of a SiO$_2$ film or the like is deposited via CVD or the like onto the top surface of the gate electrodes 17a, 17b, 17c, contact regions 14a, 14b, and source regions 15a, 15b, 15c, 15d. Next, a photoresist film is coated onto the interlayer insulating film, and the photoresist film is patterned using photolithography technology. A portion of the interlayer insulating film is selectively removed via dry etching using the patterned photoresist film as a mask. Thereafter, the photoresist film is removed via a removal solution, ashing, or the like. As a result, as shown in FIG. 19A, an interlayer insulating film 18 is formed so as to cover the gate electrodes 17a, 17b, and 17c.

Figures 19A, 19B:
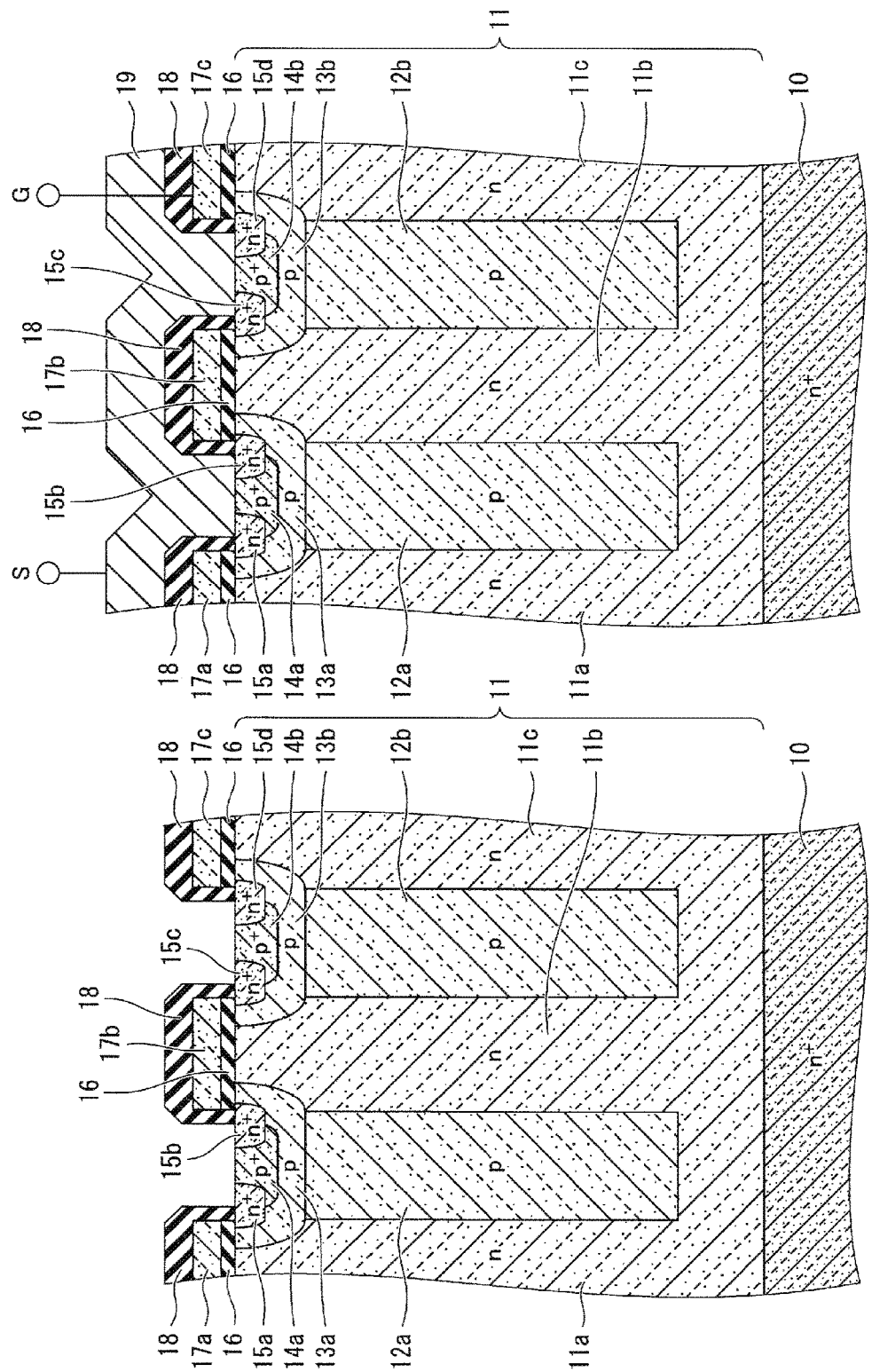
FIGS. 19A and 19B are cross-sectional views of steps after that of FIG. 18B that show one example of a manufacturing method of a unipolar protection element according to an embodiment of the present invention.

(g) Next, as shown in FIG. 19B, a source electrode 19 formed of Al or the like is formed on the top surface of the contact regions 14a, 14b, and source regions 15a, 15b, 15c, 15d using sputtering, evaporation, or the like. Thereafter, the semiconductor substrate 10 is ground and polished from the rear surface side, forming a drain region 10, after which, as shown in FIG. 2, a collector electrode 39 formed of Au or the like is formed on the rear surface of the drain region 10 using sputtering, evaporation, or the like.

(h) Next, by irradiating the semiconductor substrate from the front surface side or the rear surface side with an electron beam at an absorbed dose of approximately 500 kGy to 1000 kGy, the carrier lifetime within the semiconductor substrate is shortened, and the forward drop voltage $V_{fq}$ of the unipolar protection element $Q_{22}$ is increased. By performing heat treatment thereafter, crystal defects, which were formed by being irradiated by the electron beam and in which the energy state is unstable, are repaired. In this manner, the unipolar protection element $Q_{22}$ used in a semiconductor device according to an embodiment of present embodiment is formed.

According to the manufacturing method of the unipolar protection element $Q_{22}$ used in the semiconductor device according to an embodiment of the present invention, it is possible to set the forward drop voltage $V_{fq}$ of the unipolar protection element $Q_{22}$ so as to be relatively higher than the forward drop voltage $V_{fd}$ of the protection diode $D_2$ by irradiating the unipolar protection element $Q_{22}$ with an electron beam, thereby increasing the forward drop voltage $V_{fq}$ of the unipolar protection element $Q_{22}$. A case was described in which the unipolar protection element $Q_{22}$ was irradiated with an electron beam after the drain electrode 20 was formed; however, the unipolar protection element $Q_{22}$ may be irradiated with the electron beam before the drain electrode 20 is formed. In addition, there are cases in which electron beam annealing is not performed after the unipolar protection element $Q_{22}$ is irradiated with the electron beam. Also, the unipolar protection element $Q_{22}$ may be irradiated with a charged particle beam containing protons, helium, or the like, or a non-charged particle beam such as a neutron beam instead of being irradiated by an electron beam.

<Manufacturing Method of Protection Diode>

Next, one example of a manufacturing method of the protection diode $D_2$ used in the semiconductor device according to an embodiment of the present invention will be described using FIGS. 20A to 21B. The manufacturing method described below is just one example, and it is possible to realize the protection diode using other types of manufacturing methods as long as these methods fall within the scope set forth in the claims.

Figure 20A:
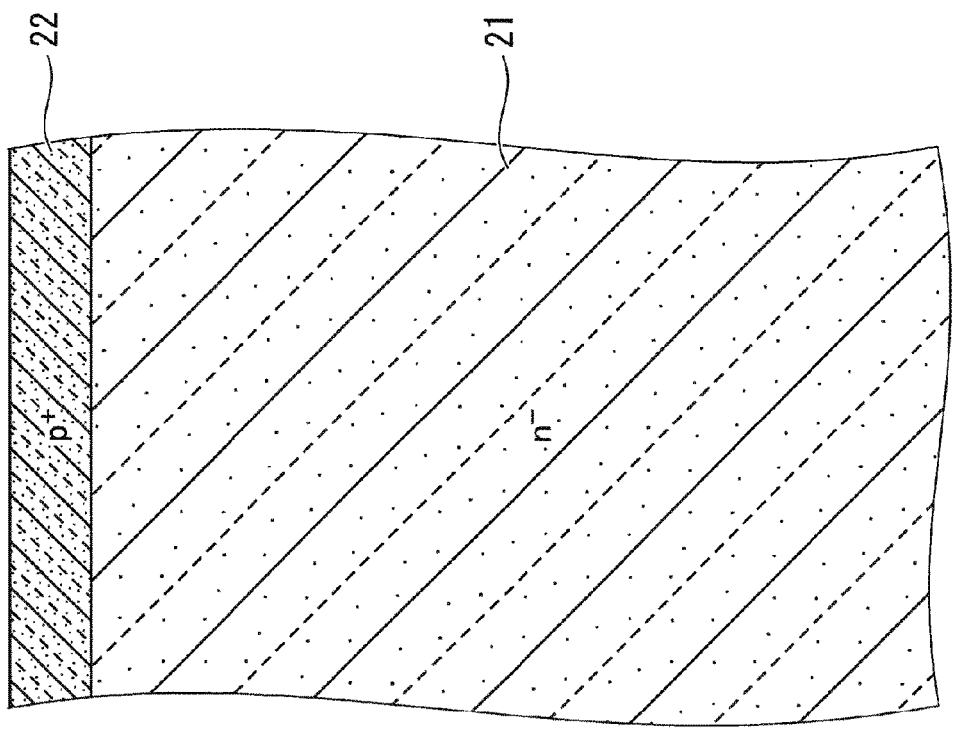
FIGS. 20A and 20B are cross-sectional views of steps that show one example of a manufacturing method of a protection diode according to an embodiment of the present invention.

(a) First, an n⁻ semiconductor substrate 21 formed of monocrystalline Si is prepared, and p-type impurity ions such as B are implanted into the front surface of the semiconductor substrate 21. Thereafter, the implanted ions are activated by performing heat treatment, and as shown in FIG. 20A, a p⁺ anode region 22 with an impurity density of approximately $5 \times 10^{17}$ to $1 \times 10^{19}$ cm⁻³, for example, is formed.

Figure 20B:
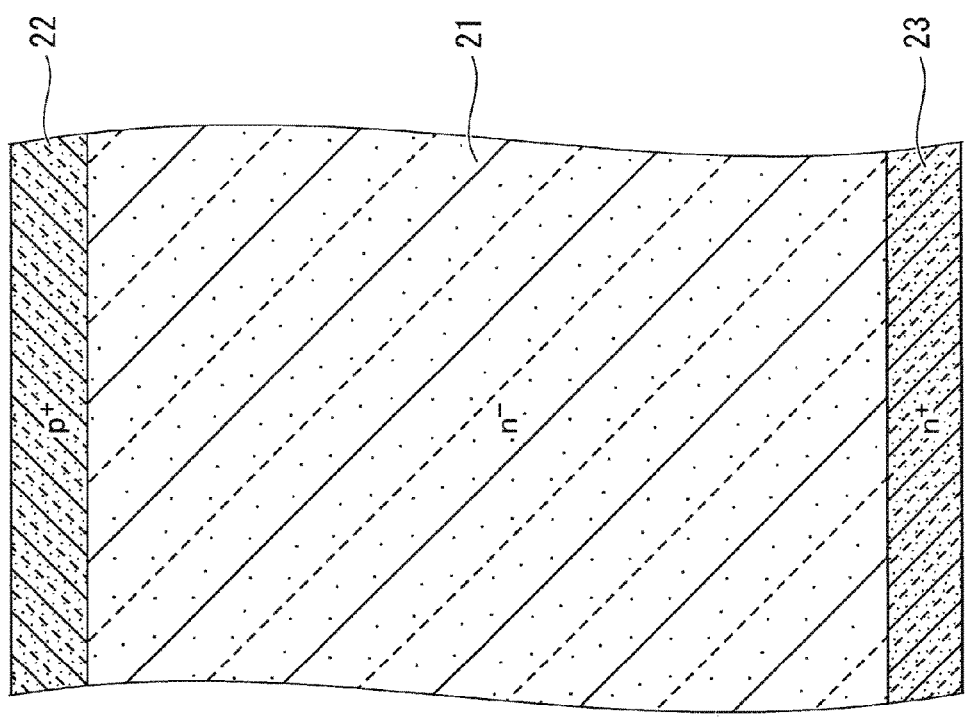

(b) Next, part of the semiconductor substrate 21 is removed from the rear surface side via grinding, wet etching, or the like, thereby giving the semiconductor substrate 21 a desired thickness (approximately 50 μm to 300 μm, for example). Ion implantation is then performed so as to implant n-type impurities such as As and P into the rear surface of the semiconductor substrate 21. Thereafter, the implanted ions are activated by performing heat treatment, and as shown in FIG. 20B, an n⁺ cathode region 23 with an impurity density of approximately $1 \times 10^{19}$ cm⁻³ to $1 \times 10^{21}$ cm³, for example, is formed.

Figure 21A:
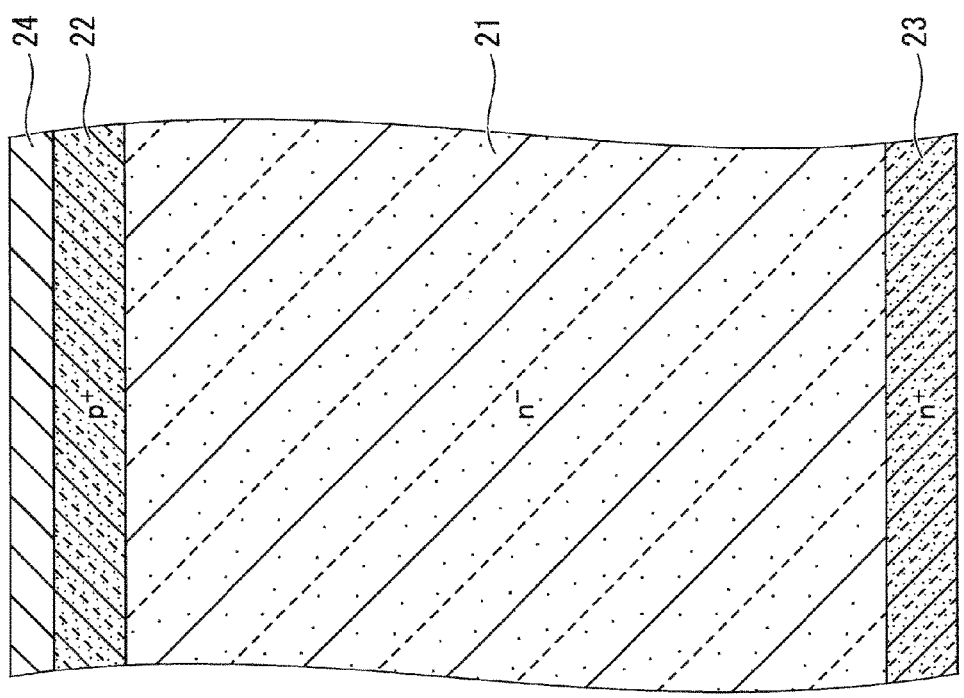
FIGS. 21A and 21B are cross-sectional views of steps after that of FIG. 20B that show one example of a manufacturing method of a protection diode according to an embodiment of the present invention.
Figure 21B:
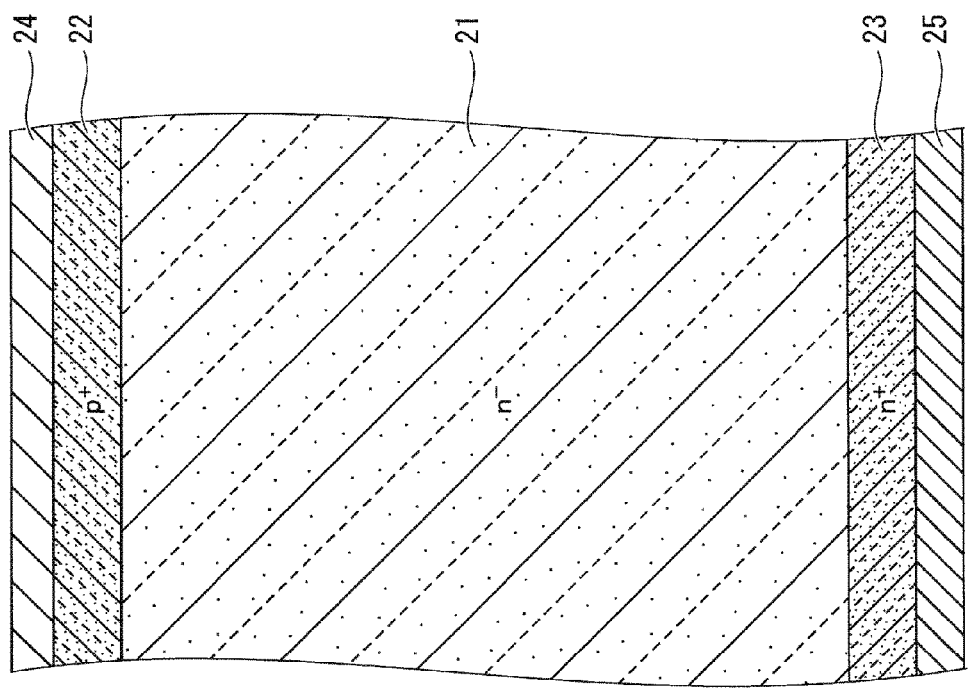

(c) Next, as shown in FIG. 21A, an anode electrode 24 formed of Al or the like is formed on the top surface of the anode region 22 via sputtering, evaporation, or the like. In a similar manner, as shown in FIG. 21B, a cathode electrode 25 formed of Au or the like is formed on the rear surface of the cathode region 23 via sputtering, evaporation, or the like.

(d) Next, by irradiating the semiconductor substrate 21 from the front surface side or the rear surface side with an electron beam at an absorbed dose of approximately 500 kGy to 1000 kGy, crystal defects for controlling the carrier lifetime within the semiconductor substrate 21 are generated. By performing heat treatment thereafter, crystal defects that were formed by being irradiated by the electron beam and in which the energy state is unstable, are repaired. In this manner, the protection diode $D_2$ shown in FIG. 3 is formed.

According to the manufacturing method of the protection diode $D_2$ used in the semiconductor device according to an embodiment of the present invention, it is possible to adjust the forward drop voltage $V_{fd}$ of the protection diode $D_2$ by irradiating the semiconductor substrate 21 with an electron beam. A case was described in which the semiconductor substrate 21 was irradiated with an electron beam after the cathode electrode 25 was formed; however, the semiconductor substrate 21 may be irradiated with the electron beam before the cathode electrode 25 is formed. In addition, the semiconductor substrate 21 may not be irradiated with an electron beam if it is not necessary to adjust the forward drop voltage $V_{fd}$ of the protection diode $D_2$.

Other Embodiments

As described above, the present invention was disclosed using an embodiment, but the description and drawings constituting a portion of the disclosure do not limit the invention. Various substitute embodiments, working examples, and applied techniques should be clear to a person skilled in the art based on this disclosure.

For example, a case was described in which the switching circuit 101 of the semiconductor device according to an embodiment of the present invention had a bipolar power switching element $Q_{11}$, a unipolar power switching element $Q_{12}$, and a freewheeling diode $D_1$ connected in parallel. The configuration of the switching circuit 101 is not limited to such a configuration, however. For example, the switching circuit 101 may have just the bipolar power switching element $Q_{11}$ and the unipolar power switching element $Q_{12}$, or may have just a single switching element such as the bipolar power switching element $Q_{11}$ or the unipolar power switching element $Q_{12}$. In addition, it is possible to form a three-phrase output inverter by using two switching circuits 101 for each phase, for example.

Also, there are no particular restrictions regarding the respective configurations of the bipolar power switching element $Q_{11}$, unipolar power switching element $Q_{12}$, and freewheeling diode $D_1$ of the switching circuit 101, and the bipolar protection element $Q_{21}$, unipolar protection element $Q_{22}$, and protection diode $D_2$ of the protection circuit 102. For example, a vertical IGBT with a trench gate structure was described as one example of the bipolar power switching element $Q_{11}$. It is possible to use a horizontal IGBT with a planar gate structure, however. In addition, SJ-MOS are suitable for the unipolar power switching element $Q_{12}$ and the unipolar protection element $Q_{22}$, but other configurations may also be used.

In this manner, it is possible to apply the present invention to the manufacturing methods of various types of semiconductor devices and to the semiconductor manufacturing devices used in such methods without departing from the scope of the present invention as disclosed in the claims.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device for driving a load, comprising:
    a protection circuit configured to be connected to said load, the protection circuit including a protection diode, a diode-connected unipolar protection element, and a diode-connected bipolar protection element, all of which are connected in parallel so that when connected to the load, the protection diode, the diode-connected unipolar protection element, and the diode-connected bipolar protection element are connected in parallel to the load; and
    a switching circuit that is connected in series to said protection circuit and that performs a switching operation so as to drive said load,
    wherein the protection diode, the diode-connected unipolar protection element, and the diode-connected bipolar protection element are connected in such a polarity that each is reverse-biased when the switching circuit is turned ON, and consume a discharge current resulting from a counter-electromotive force from said load when the switching circuit is turned OFF.

2. The semiconductor device according to claim 1, wherein a forward drop voltage of the protection diode is lower than a forward drop voltage of the diode-connected unipolar protection element.

3. The semiconductor device according to claim 2, wherein a difference obtained by subtracting the forward drop voltage of the protection diode from the forward drop voltage of the diode-connected unipolar protection element is greater than 0V and less than or equal to 15V.

4. The semiconductor device according to claim 2, wherein the diode-connected unipolar protection element is irradiated with a particle beam to decrease the forward drop voltage of the diode-connected unipolar protection element.

5. The semiconductor device according to claim 1, wherein said switching circuit comprises a freewheeling diode, a unipolar power switching element, and a bipolar power switching element that are all connected in parallel.

6. The semiconductor device according to claim 2, wherein said switching circuit comprises a freewheeling diode, a unipolar power switching element, and a bipolar power switching element that are all connected in parallel.

7. The semiconductor device according to claim 3, wherein said switching circuit comprises a freewheeling diode, a unipolar power switching element, and a bipolar power switching element that are all connected in parallel.

8. The semiconductor device according to claim 4, wherein said switching circuit comprises a freewheeling diode, a unipolar power switching element, and a bipolar power switching element that are all connected in parallel.

9. A semiconductor device for driving a load, comprising:
    a protection circuit having a first node and a second node configured to be connected to respective terminals of said load, the protection circuit including a protection diode, a diode-connected unipolar transistor, and a diode-connected bipolar transistor, all of which are connected in parallel between said first node and said second node in a reversed-biased manner, the first node being configured to be connected to a positive terminal of a DC power source; and
    a switching circuit having a first node and a second node, the switching circuit including a unipolar transistor and a bipolar transistor, connected in parallel to each other between the first node and the second node, respective gates of the unipolar transistor and the bipolar transistor being commonly controlled, the first node of the switching circuit being connected to the second node of the protection circuit, and the second node of the switching circuit being configured to be connected to a negative terminal of said DC power source so that when the switching circuit is turned ON, the load is driven by a current path formed between said first node of the protection circuit and said second node of the switching circuit, and when the switching circuit is turned OFF, the protection circuit consumes a discharge current resulting from a counter-electromotive force from said load.

* * * * *

UNITED STATES PATENT AND TRADEMARK OFFICE
CERTIFICATE OF CORRECTION

PATENT NO. : 10,050,029 B2
APPLICATION NO. : 15/232479
DATED : August 14, 2018
INVENTOR(S) : Tohru Shirakawa It is certified that error appears in the above-identified patent and that said Letters Patent is hereby corrected as shown below:

In the Specification

Column 9, Line 34, the text "the drift region 211" should be changed to -- the drift region 21 --.

Column 14, Line 20, the text "to $1 \times 10^{21} cm^3$" should be changed to -- to $1 \times 10^{21} cm^{-3}$ --.

Signed and Sealed this
Twenty-fifth Day of September, 2018

Andrei Iancu
*Director of the United States Patent and Trademark Office*